(12) United States Patent
Schmidt et al.

(10) Patent No.: US 11,933,922 B2
(45) Date of Patent: Mar. 19, 2024

(54) SUPERCONDUCTING MULTI-LAYER TRANSITION-EDGE SENSOR AND HYBRID SUBTRACTIVE-ADDITIVE PRODUCTION OF A SUPERCONDUCTING MULTI-LAYER TRANSITION-EDGE SENSOR

(71) Applicant: Government of the United States of America, as represented by the Secretary of Commerce, Gaithersburg, MD (US)

(72) Inventors: Daniel Richard Schmidt, Boulder, CO (US); Joel Calvin Weber, Boulder, CO (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 467 days.

(21) Appl. No.: 17/192,943

(22) Filed: Mar. 5, 2021

(65) Prior Publication Data
US 2021/0278551 A1    Sep. 9, 2021

Related U.S. Application Data

(60) Provisional application No. 62/985,406, filed on Mar. 5, 2020.

(51) Int. Cl.
*H10N 60/01* (2023.01)
*G01T 1/16* (2006.01)
*G03F 7/00* (2006.01)

(52) U.S. Cl.
CPC .............. *G01T 1/16* (2013.01); *G03F 7/0035* (2013.01); *H10N 60/0128* (2023.02)

(58) Field of Classification Search
CPC ..... G01T 1/16; G03F 7/0035; H10N 60/0128; H10N 60/01; H10N 60/84
See application file for complete search history.

(56) References Cited

U.S. PATENT DOCUMENTS

| | | |
|---|---|---|
| 5,880,468 A | 3/1999 | Irwin et al. |
| 6,211,519 B1 | 4/2001 | Nam et al. |

(Continued)

OTHER PUBLICATIONS

Hilton, G.C., et al., "Microfabricated Transition-Edge X-ray Detectors", IEEE Transactions on Applied Superconductivity, 2001, p. 739-742, vol. 11 No. 1.

(Continued)

*Primary Examiner* — Mesfin T Asfaw
(74) *Attorney, Agent, or Firm* — Office of Chief Counsel for National Institute of Standards and Technology

(57) ABSTRACT

Hybrid subtractive-additive production of a superconducting multi-layer transition-edge sensor includes: forming a superconductor layer; forming a patterning photoresist on the superconductor layer; forming a sensor pattern in the patterning photoresist; subtractively forming, from the superconductor layer, the superconductor sensor layer; removing the patterning photoresist from the superconductor sensor layer; forming a template photoresist on the superconductor sensor layer; forming an inverse normal metal layer pattern in the template photoresist and exposing a bilayer portion of the superconductor sensor layer for addition of a normal metal layer; and additively forming the normal metal layer on the superconductor sensor layer such that the sensor pattern is interposed between the normal metal layer and the substrate.

18 Claims, 18 Drawing Sheets

(56) References Cited

U.S. PATENT DOCUMENTS 6,239,431 B1    5/2001   Hilton et al.
6,765,207 B2    7/2004   Goldie et al.
8,674,302 B2    3/2014   Sadleir

OTHER PUBLICATIONS

Irwin, J.N., et al., "Transition-Edge Sensors", Topics in Applied Physics, 2005, p. 63-149, vol. 99.
Ullom, J.N., et al., "Review of Superconducting Transition-Edge Sensors for X-ray and Gamma-ray Spectroscopy", Superconductor Science and Technology, 2015, p. 084003, vol. 28.
Commercial product using existing bilayer superconducting transition edge sensors: Star Cryo-Electronics, Microcal X-ray Spectrometer, https://starcryo.com/microcal-x-rayspectrometers/, accessed Mar. 4, 2020.

(A) 207   Meander pattern

207   Cross-section along line A-A (B) 207   Filament pattern

207   Cross-section along line A-A (C) 207   Plenum pattern

207   Cross-section along line A-A (D) 207   Perforated pattern

207   Cross-section along line A-A (E) 207   Aperture pattern

207   Cross-section along line A-A (a) 1 μm evaporated Bi absorber

Tail fraction: 10%

(b) Gold absorber only

Tail fraction: 2.1%

(c) 3 μm electroplated Bi absorber

Tail fraction: 3.0%

(a)

$T_c$: 70 mK, Size: 480 μm x 240 μm
$E_{sat}$: ~6 keV (b)

$T_c$: 77 mK, Size: 465 μm x 185 μm
$E_{sat}$: ~3 keV, 3 μm Bi Absorber
(c) 0.56 eV at 705 eV Fe L-photons $T_c$: 50 mK, Size: 465 μm x 185 μm
$E_{sat}$: ~1.2 keV

SUPERCONDUCTING MULTI-LAYER TRANSITION-EDGE SENSOR AND HYBRID SUBTRACTIVE-ADDITIVE PRODUCTION OF A SUPERCONDUCTING MULTI-LAYER TRANSITION-EDGE SENSOR

CROSS REFERENCE TO RELATED APPLICATIONS

The application claims priority to U.S. Provisional Patent Application Ser. No. 62/985,406 filed Mar. 5, 2020, the disclosure of which is incorporated herein by reference in its entirety.

STATEMENT REGARDING FEDERALLY SPONSORED RESEARCH

This invention was made with United States Government support from the National Institute of Standards and Technology (NIST), an agency of the United States Department of Commerce. The Government has certain rights in the invention. Licensing inquiries may be directed to the Technology Partnerships Office, NIST, Gaithersburg, Md., 20899; voice (301) 975-2573; email tpo@nist.gov; reference NIST Docket Number 18-036US1.

BRIEF DESCRIPTION

Disclosed is a process for hybrid subtractive-additive production of a superconducting multi-layer transition-edge sensor, the process comprising: forming a superconductor layer on a substrate, the superconductor layer comprising a nascent topography; forming a patterning photoresist on the superconductor layer such that the superconductor layer is interposed between the patterning photoresist and the substrate; forming a sensor pattern in the patterning photoresist and exposing an exposed portion of the superconductor layer for removal; subtractively forming, from the superconductor layer, the superconductor sensor layer comprising the sensor pattern by removing the exposed portion from the superconductor layer; removing the patterning photoresist from the superconductor sensor layer; forming a template photoresist on the superconductor sensor layer such that the superconductor sensor layer is interposed between the template photoresist and the substrate; forming an inverse normal metal layer pattern in the template photoresist and exposing a bilayer portion of the superconductor sensor layer for addition of a normal metal layer; and additively forming the normal metal layer comprising a normal metal pattern on the superconductor sensor layer such that the sensor pattern is interposed between the normal metal layer and the substrate to produce the superconducting multi-layer transition-edge sensor.

BRIEF DESCRIPTION OF THE DRAWINGS

The following description cannot be considered limiting in any way. With reference to the accompanying drawings, like elements are numbered alike.

DETAILED DESCRIPTION

Figure 1:
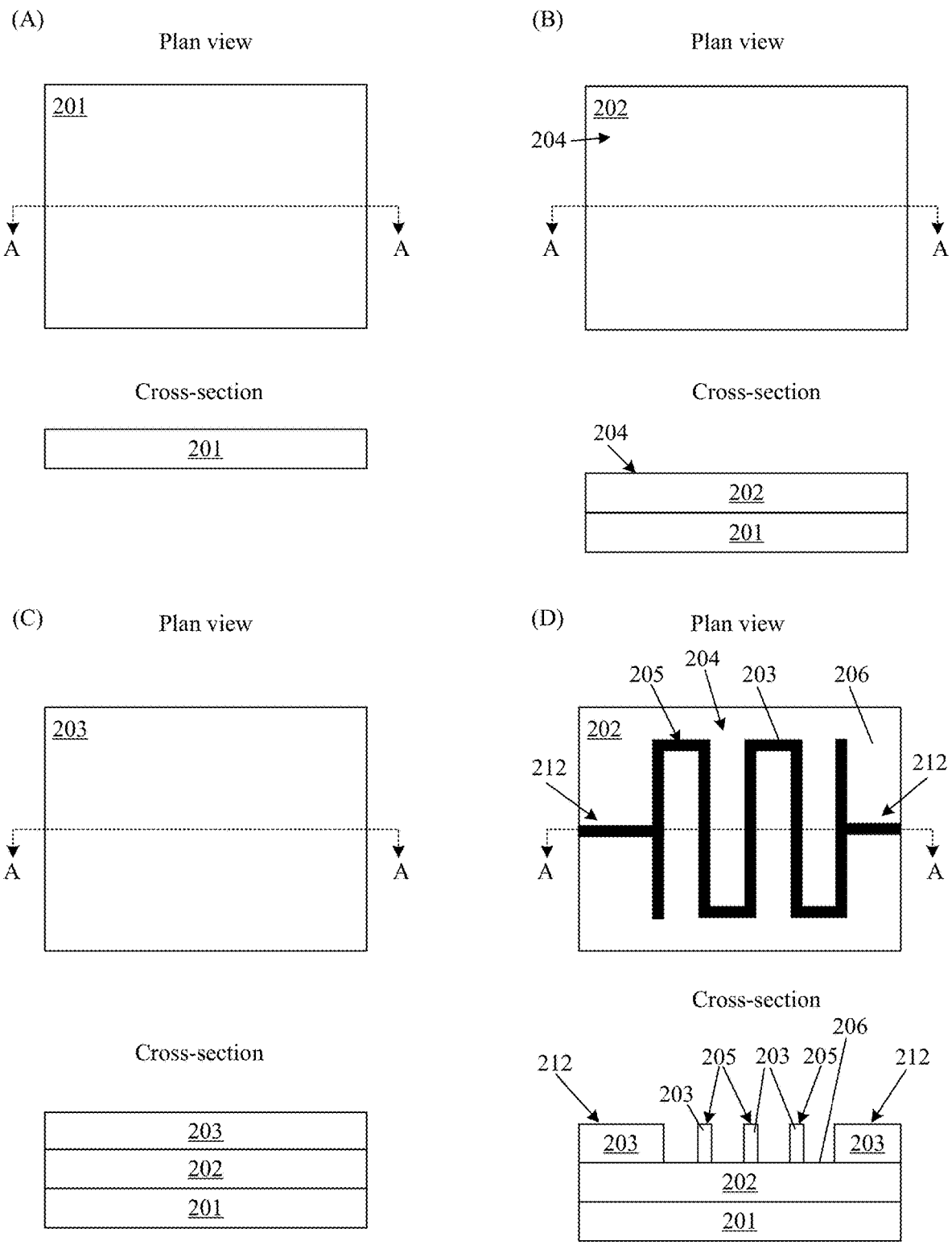
FIG. 1 shows plan views and cross-sections of materials for steps in forming a superconducting multi-layer transition-edge sensor shown in panel B of FIG. 3.

A detailed description of one or more embodiments is presented herein by way of exemplification and not limitation.

It should be appreciated that accurate detection of particles, including photons, molecules, electrons, ions and phonons, is involved in many industrial and research measurements. X-ray microcalorimeters convert X-ray energy into heat in the form of hot electrons or phonons. An X-ray microcalorimeter can include an absorber to stop and thermalize incident X-rays and a thermometer to measure the resulting temperature rise. The first X-ray microcalorimeters used insulating or superconducting absorbers for low heat capacity and a semiconductor thermistor thermometer. While these achieve energy resolution about 7.1 eV FWHM at 6 keV, the response time is intrinsically slow. Another X-ray microcalorimeter includes a normal-metal absorber and a NIS tunnel junction to measure temperature rise, wherein the response is fast but has energy resolution that is 18 eV FWHM at 6 keV.

Superconducting transition-edge sensors can be used as a thermometer in an X-ray microcalorimeter. A temperature of a superconducting film is held within the superconducting transition, and heat deposited in the film is measured via temperature dependence of the film's electrical resistance in this region. For X-ray detection, transition temperature $T_c$ can be between 50 millikelvin (mK) and 150 mK. The choice of the $T_c$ within this range depends on the desired detector parameters. Superconducting tungsten films having $T_c$=70 mK can be used for X-ray detection. For an elemental superconductor such as tungsten, the transition temperature can be a fixed property of the metal and can be difficult to tune to suit specific applications. For alloys of superconductors with normal metals, the $T_c$ can be adjusted, but the transition edge may not be sharp, and the alloys may not stable. The transition temperature can be adjusted via the proximity effect in superconductor/normal-metal bilayers. When a clean interface is made between a superconducting film and a normal-metal film, and the films are thinner than the relevant coherence lengths, the bilayer acts as a single superconducting film with a transition temperature suppressed from that of the bare superconductor. By varying the relative film thickness, the $T_c$ of the bilayer can be adjusted. Iridium/gold bilayers can be used for particle detection. The $T_c$ of elemental iridium is 112 mK, which is within the target range for X-ray detection. However, the Ir/Au system can be difficult to reproducibly fabricate and involves its substrate to be heated in a very clean, high vacuum deposition system, wherein the transition temperature of such bilayers may be less than 112 mK. Other bilayer systems include an aluminum/normal-metal bilayer that can have a larger tunable transition temperature range, that may be more easily deposited without heating the substrate, and that are deposited in a deposition system with only moderate vacuum (e.g., 1e-7 torr) to provide more reliably reproducible, sharper superconducting transitions. Aluminum/normal-metal bilayers have been used as transition-edge sensors and have reproducible transition temperatures that is tunable as a function of the thicknesses of the individual layers, and the transition edge is extremely sharp.

During operation, the TES can be maintained within the transition region by electrothermal feedback (ETF). The transition from a superconducting state to a normal state is measured to determine energy deposited in the system by particles. The bilayer resistance can be monitored by voltage biasing the bilayer and measuring the current through the bilayer, e.g., with a superconducting quantum interference device (SQUID). The increase in bilayer resistance with temperature leads to a reduction in measured current. In an ETF-TES configuration, the energy deposited in the bilayer of the TES is approximately the integral of the reduction in feedback Joule heating or the bias voltage multiplied by the integral of the change in measured current. The bilayer resistance can be monitored by current biasing while measuring the voltage across the bilayer with FET. There is a continuum of biasing conditions between voltage biasing and current biasing that can be used in the measurement. The superconducting transition can also be measured, e.g., by a change in the self-magnetic inductance or mutual-magnetic inductance of a coil or coils placed around the bilayer or by a kinetic inductance measurement.

As provided herein, a superconducting multi-layer transition-edge sensor can be made by a hybrid subtractive-additive process in which a superconductor sensor layer of a multi-layer is deposited and patterned completely with a subtractive process before subsequent layers are deposited and patterned using a separate additive processes. It should be appreciated that transition-edge sensors can be produced using a superconducting bilayer, a multi-layer formed from two metal films, one a superconductor and the other a normal metal. Conventionally, both metal films are deposited in the same deposition step and must be processed as a bilayer film. As described herein, a hybrid subtractive-additive production of a superconducting multi-layer transition-edge sensor provides a first layer to be patterned before the second layer is deposited. The hybrid subtractive-additive process for each layer can be optimized independently. The first layer can be patterned and inspected before the second layer is deposited permitting quality assurance, inspection, and the production of structures not available by conventional methods. The hybrid subtractive-additive process can make superconducting multi-layer transition-edge sensor that includes two or more metal layers.

Hybrid subtractive-additive production of a superconducting multi-layer transition-edge sensor provides an increased flexibility over conventional methods. A superconductor multilayer system can include a molybdenum/gold bilayer. For film stress reasons, sputtering deposition can be used to form the molybdenum layer, and evaporation deposition can from the gold layer since the film resistivity of gold is lower than molybdenum. In hybrid subtractive-additive production of a superconducting multi-layer transition-edge sensor, formation of each layer of the bilayer can be performed independently. Conventionally, the gold layer in the molybdenum/gold material system is patterned in a subtractive manner using chemical or physical methods. Hybrid subtractive-additive production of a superconducting multi-layer transition-edge sensor provides the gold layer to be patterned additively during deposition through a lift-off mask. Moreover, in conventional processes, only one type of molybdenum/gold bilayer combination cam be formed in a fabrication run. Advantageously, the process for hybrid subtractive-additive production of the superconducting multi-layer transition-edge sensor is not limited to the number of additional lift-off layers. With multiple lift-off layers, the gold thickness can be adjusted to modify transition temperature $T_c$ and resistance. An amount of molybdenum pre-cleaning can be changed to modify transition temperature $T_c$ to provide determination of bilayer properties with a calibration run. The process for hybrid subtractive-additive production of the superconducting multi-layer transition-edge sensor can be applied to hybrid sensor arrays for detection of multiple power or energy ranges.

Figure 3:
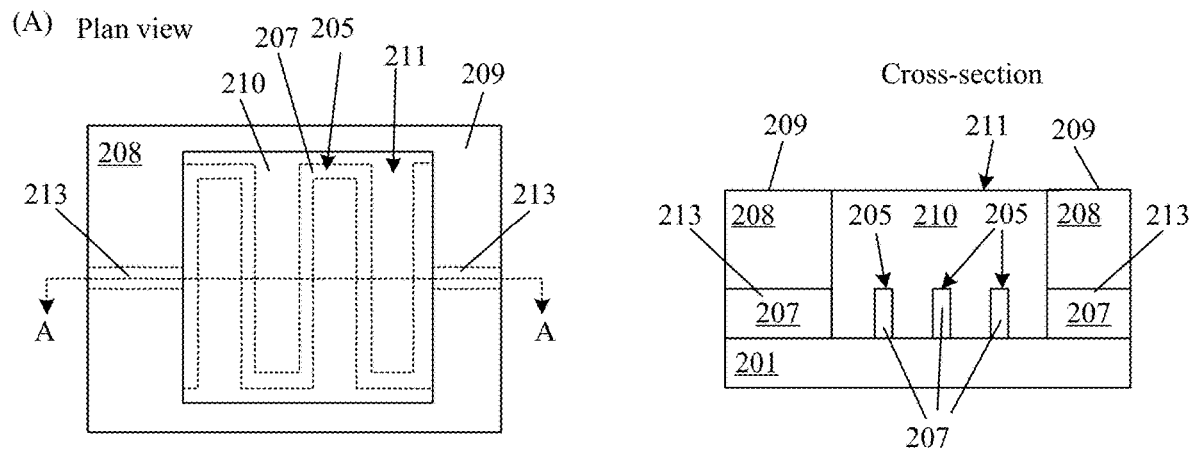
FIG. 3 shows plan views and cross-sections of materials for steps in forming the superconducting multi-layer transition-edge sensor shown in panel B.
Figure 3:
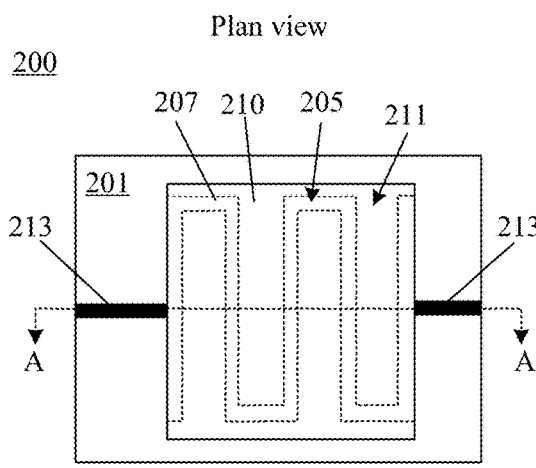
Figure 3:
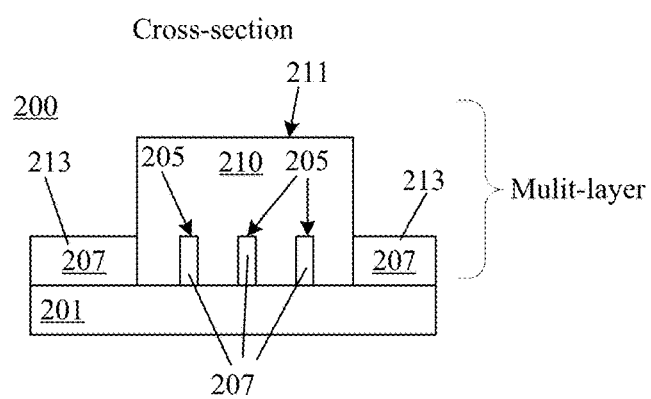
Figure 7:
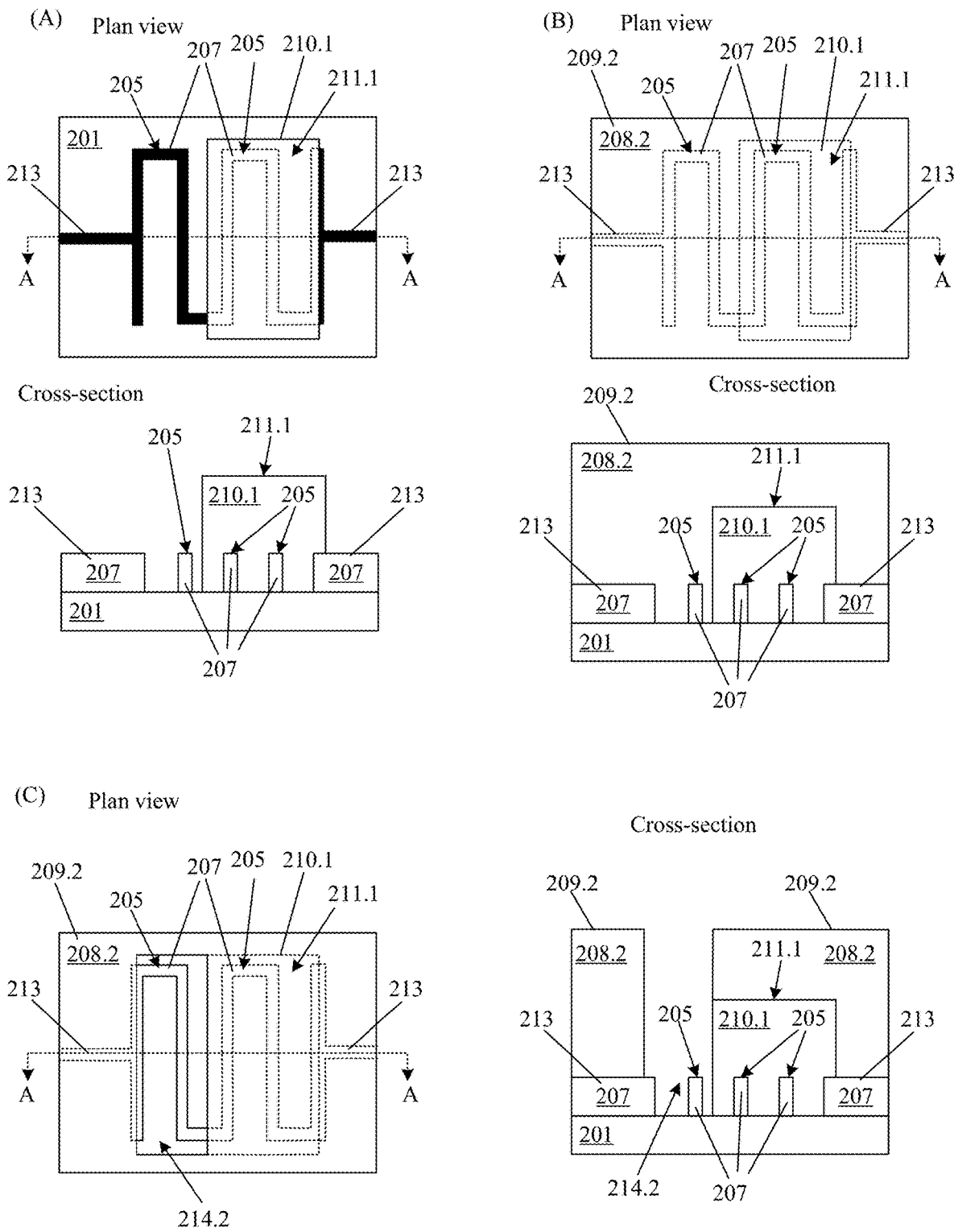
FIG. 7 shows plan views and cross-sections of materials for steps in forming a superconducting multi-layer transition-edge sensor shown in panel B of FIG. 8.
Figure 8:
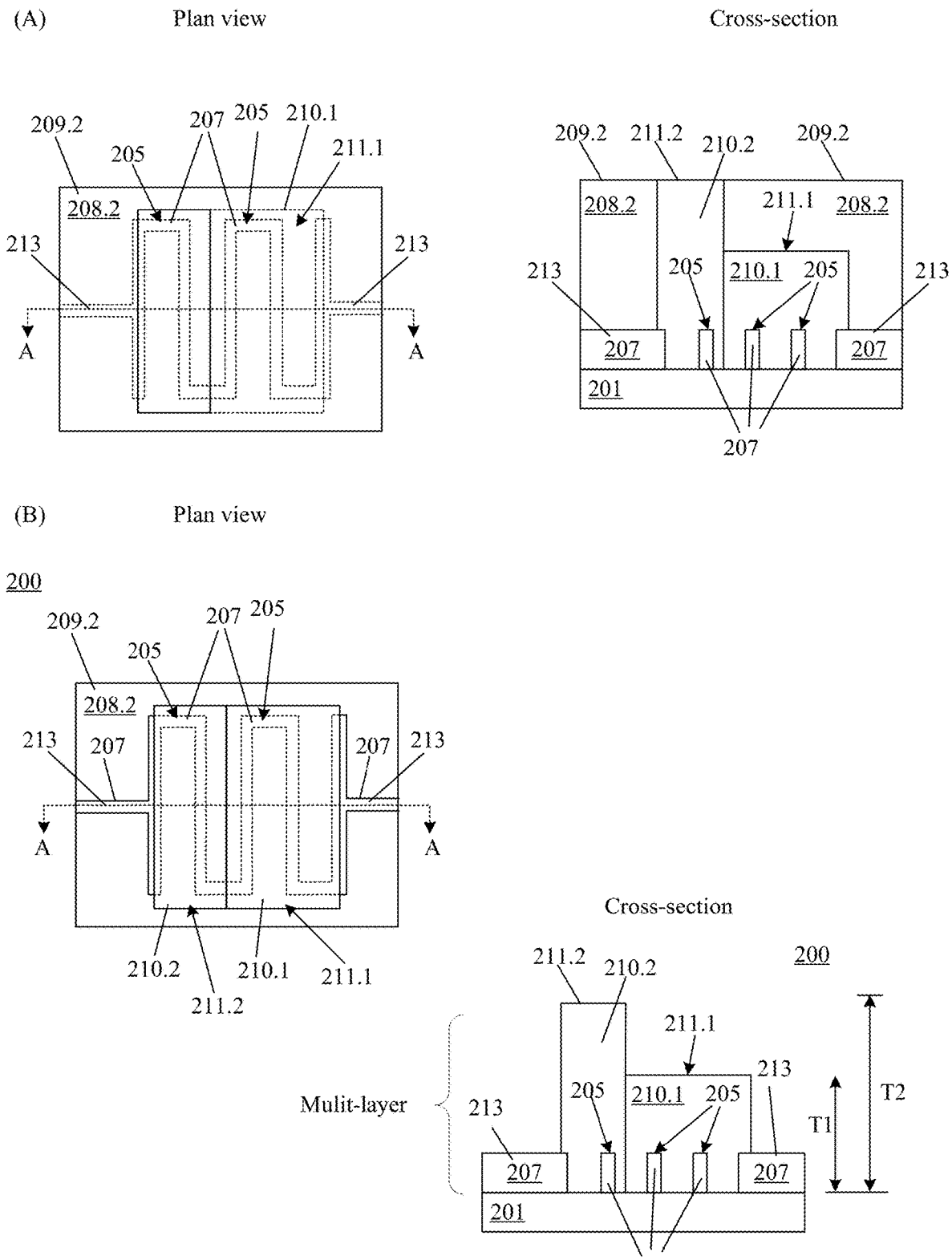
FIG. 8 shows plan views and cross-sections of materials for steps in forming a superconducting multi-layer transition-edge sensor shown in panel B.

In an embodiment, with reference to FIG. 3 and FIG. 8, superconducting multi-layer transition-edge sensor 200 includes superconductor sensor layer 207 disposed on substrate 201 and comprising sensor pattern 205 in electrical communication with sensor wire 213; and normal metal layer 210 disposed on sensor pattern 205 of superconductor sensor layer 207 and including normal metal pattern 211. Different portions of sensor pattern 205 of superconductor sensor layer 207 can have different normal metal layer 210 (e.g., first normal metal layer 210.1, second normal metal layer 210.2) disposed on sensor pattern 205 as shown in panel C of FIG. 7.

Superconducting multi-layer transition-edge sensor 200 can be made from various elements and components. Substrate 201 can include a dielectric material that mechanically supports other components of superconducting multi-layer transition-edge sensor 200. Exemplary materials for substrate 201 include semiconductors, sapphire, quartz, mica, ceramic, glass, plastic, oxides of various metals, and the like. A size or shape of substrate 201 can be selected in view of particular processing conditions or application environments.

Figure 9:
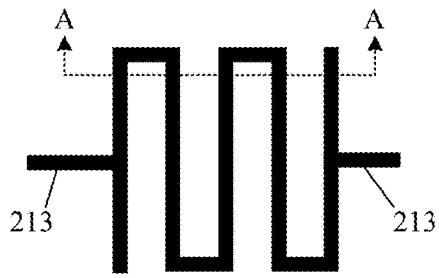
FIG. 9 shows a plan view and cross-section of a meander pattern of a superconductor sensor layer in panel A, a plan view and cross-section of a filament pattern of a superconductor sensor layer in panel B, a plan view and cross-section of a plenum pattern of a superconductor sensor layer in panel C, a plan view and cross-section of a perforated pattern of a superconductor sensor layer in panel D, and a plan view and cross-section of an aperture pattern of a superconductor sensor layer in panel E.
Figure 9:
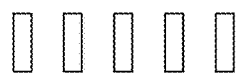
Figure 9:
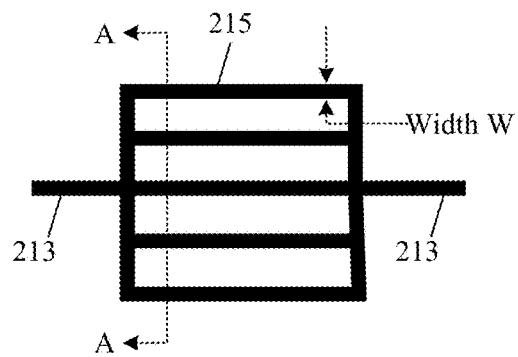
Figure 9:
Figure 9:
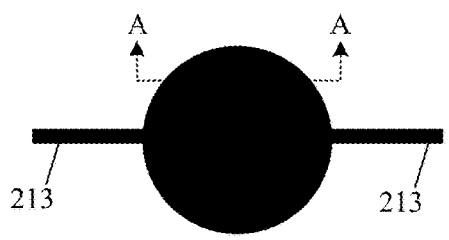
Figure 9:
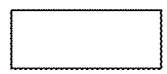
Figure 9:
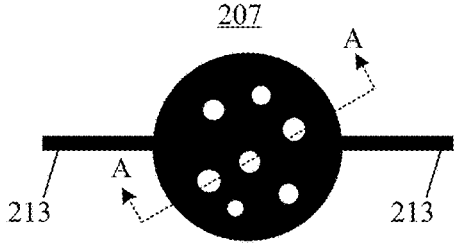
Figure 9:
Figure 9:
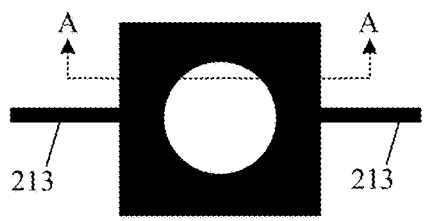
Figure 9:
Figure 17:
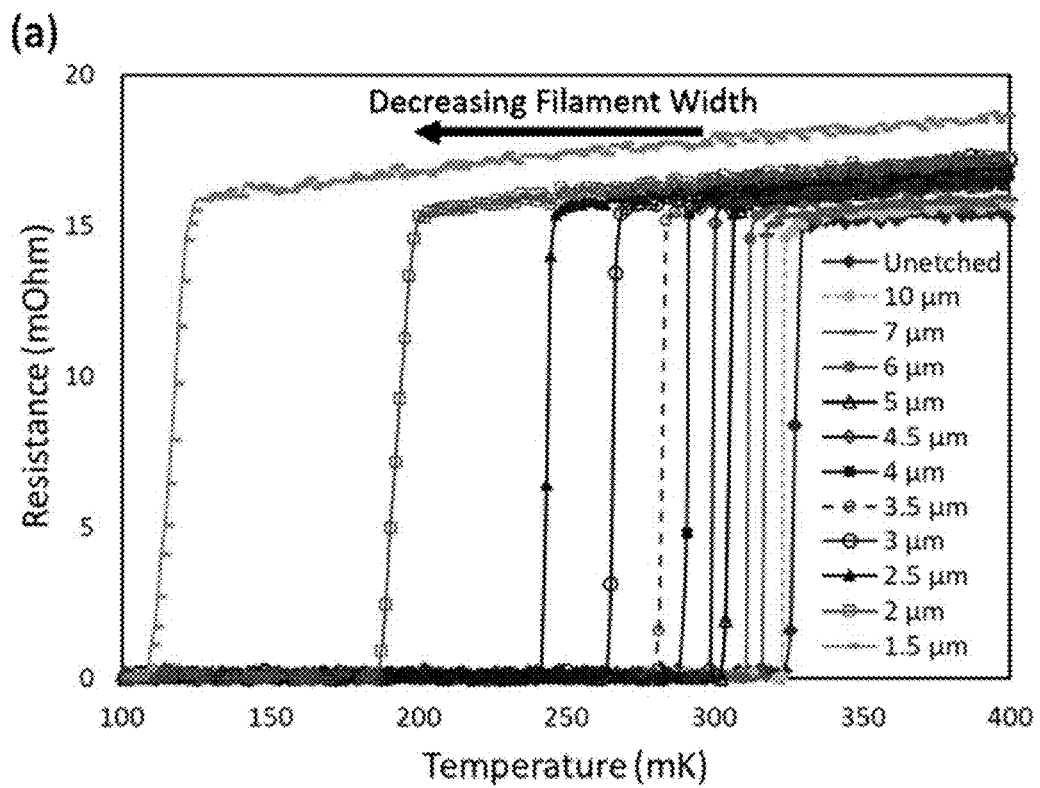
FIG. 17 shows (a) a graph of resistance versus temperature for variations of the filament pattern that were tested with an unetched (no filaments) 45 nm Mo/350 nm Au yielding $T_c$=327 mK and $R_n$=15 mΩ. A device with 10 μm Mo lines and 5 μm wide gaps decreases the $T_c$ to 323 mK with $R_n$=15 mΩ. This trend continues down to 1.5 μm wide Mo lines with 5 μm gaps, yielding $T_c$=117 mK with $R_n$=16 mΩ. A device with 1 μm features was also tested but had a $T_c$ below $T_{bath}$=80 mK. (b) Measured temperature suppression plotted as a function of Mo filament width. Data are plotted against equation (2) with $D_s$ used as a fitting parameter. A best fit was obtained with $D_s$=0.025 m² s⁻¹. This value can be attributed to interface transparency in the superconducting multi-layer transition-edge sensor between the N/S/N junction due to hybrid subtractive-additive production of the superconducting multi-layer transition-edge sensor. The etched Mo filaments were parallel to the direction of current flow as shown in the inset of panel B.
Figure 17:
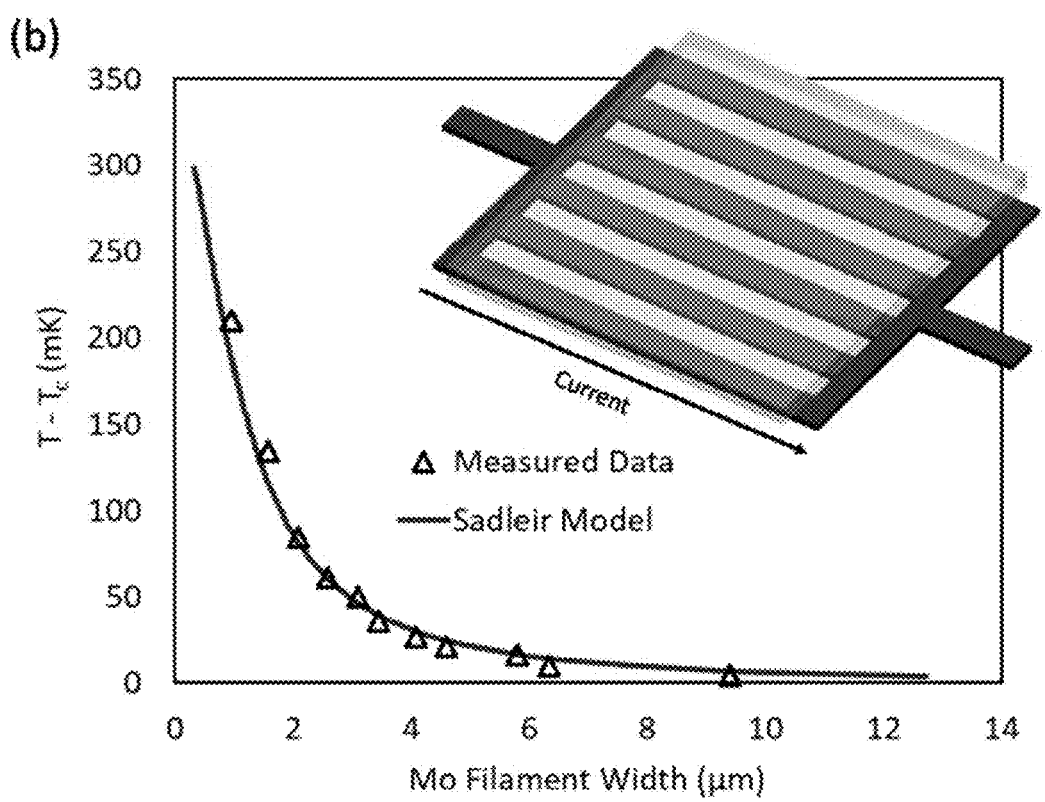

Superconductor layer 202 is disposed on substrate 201 for formation of superconductor sensor layer 207 from superconductor layer 202. Superconductor layer 202 and superconductor sensor layer 207 can include electrically conductive materials such as a superconducting metal that is electrically superconducting a temperature that is less than or equal to the transition temperature $T_c$ of the superconducting metal. The superconducting metal of the superconductor sensor layer 207 can include an elemental superconductor or an alloy superconductor. Exemplary elemental superconductors include molybdenum, iridium, aluminum, and the like. Exemplary alloy superconductors include niobium-titanium, germanium-niobium, niobium nitride, and the like. Exemplary methods of producing superconductor sensor layer 207 include DC magnetron sputtering, reactive sputtering, thermal deposition, electron-beam deposition, ion beam deposition, atomic layer deposition, and pulsed laser deposition. Superconductor sensor layer 207 can be superconducting at a temperature from 0.1 K to 20 K, specifically from 0.1 K to 10 K, and more specifically from 0.1 K to 5 K. Sensor pattern 205 can have an arbitrary pattern selected for particular operability of superconducting multi-layer transition-edge sensor 200 with respect to its transition temperature range, e.g., see FIG. 17 and FIG. 18. While the geometrical shape of sensor pattern 205 is arbitrary, exemplary patterns for sensor pattern 205 include a meander pattern, a filament pattern, a plenum pattern, a perforated pattern, or an aperture pattern as shown in FIG. 9. It should be appreciated that width W can be selected and varied or the same throughout all parts of superconductor sensor layer 207. In an embodiment, superconductor sensor layer 207 includes a plurality of filaments 215 in sensor pattern 205, wherein sensor pattern 205 includes the filament pattern of the plurality of filaments 215. Width W of each of the filaments can be substantially identical to one another within a selected amount, e.g., 1%. It is contemplated that width W of some of the filaments can be different to provide a selected transition temperature Tc, multiple selected transition temperatures, and selected transition temperature widths to the superconducting multi-layer transition-edge sensor 200. Filaments independently can have width W from 50 nanometers (nm) to 500 micrometers (µm), specifically from 500 nm to 50 µm, and more specifically from 500 nm to 10 µm. Without wishing to be bound by theory, the width of the filaments can determine Tc, wherein by using a distribution of widths, the width or overall shape of the transition region can be selectively tailored and controlled. The steepness of the transition region controls the effective gain when operating with electro-thermal feedback. The shape include a low Tc sharp transition followed by a broad transition to provide superconducting multi-layer transition-edge sensor 200 with a sensitive low dynamic range mode and a less sensitive high dynamic range mode. An array of superconducting multi-layer transition-edge sensors 200 can be used for cosmic microwave background detection. Superconducting multi-layer transition-edge sensor 200 with a plurality of independent sharp transition can be used, e.g., to provide Tc of 50 mK and Tc 500 mK so that the same superconducting multi-layer transition-edge sensor 200 can be used in two different modes of operation.

Normal metal layer 210 is disposed on sensor pattern 205 of superconductor sensor layer 207, wherein superconductor sensor layer 207 is interposed between normal metal layer 210 and substrate 201. Normal metal layer 210 include a normal metal that is electrically conductive. The normal metal of the normal metal layer 210 can include an elemental metal, metalloid, or a metal alloy thereof. Elemental metals include transition metals such as gold, post-transition metals such as aluminum, or metalloids such as silicon, and the like. Metal alloys include binary alloys, ternary alloys, and the like such as gold-silver. Exemplary methods of producing normal metal layer 210 include DC magnetron sputtering, reactive sputtering, thermal deposition, electron-beam deposition, ion beam deposition, atomic layer deposition, and pulsed laser deposition. Different portions of sensor pattern 205 of superconductor sensor layer 207 can have different normal metal layer 210 (e.g., first normal metal layer 210.1, second normal metal layer 210.2) disposed on sensor pattern 205 as shown in panel C of FIG. 7. A number of different normal metal layers 210 can be selected for a particular functionality of superconducting multi-layer transition-edge sensor 200, e.g., with respect to transition temperature range or operating environment. The number of different normal metals layers can be, e.g., two to hundreds. The different normal metals 210 can have identical or different normal metals, shapes, or sizes. Regarding size, each normal metal layer 210 independently can have a thickness T (e.g., first thickness T1 and second thickness T2) from 50 nanometers (nm) to 500 micrometers (μm), specifically from 500 nm to 50 μm, and more specifically from 500 nm to 10 μm. It should be appreciated that the different normal metal layers can be formed independently in separative additive formation steps.

Patterning photoresist 203 and template photoresist 208 are used respectively to form superconductor sensor layer 207 and normal metal layer 210. In an embodiment, photoresist (203, 208) independently includes a resist material that polymerizes or crosslinks and subsequently becomes more insoluble in a developer after the resist material is exposed to a radiation source. Photoresist (203, 208) can be a negative tone development (NTD) resist, wherein its solubility in a developer decreases upon being subjected to radiation. An example of the resist material is a polymer such as a cross-linkable polymer, cross-linker, and the like, wherein the polymer can cross-link upon radiation. Photoresist (203, 208) can include a polymer having a functional group such as a photo-acid generator (PAG), a thermal-acid generator (TAG), a photo-base generator (PBG), a photo-decomposable base (PDB), a photo-decomposable quencher (PDQ), or other photosensitive functional groups. Exemplary photoresist compositions include resists sensitive to radiation such as ultraviolet light (e.g., 405 nm or 365 nm radiation), deep ultraviolet light (e.g., 248 nm or 193 nm radiation), extreme ultraviolet light (e.g., 13.5 nm light), an e-beam, an x-ray, or an ion beam. Photoresists (203, 208) can include a solvent on deposition that is subsequently removed during spin coating, a settling process, a post-application or pre-exposure baking process. Pre-exposure baking can be implemented by suitable equipment such as a hotplate at a temperature suitable for the particular composition of photoresist (203, 208) and solvent employed.

Exposure of photoresist (203, 208) to radiation can be performed in air, in a liquid (immersion lithography), or in vacuum (e.g., for EUV lithography and e-beam lithography). In an embodiment, exposure can include photolithography with a photomask that includes a pattern providing, e.g., sensor pattern 205, as an opening for radiation to become incident at superconductor layer 202 as well as for formation of normal metal layer 210. In some embodiments, the radiation directly patterns photoresist (203, 208) in an absence of a photomask (such as using a digital pattern generator or direct-write mode). The developer can include an organic solvent or an aqueous solvent. Depending on photoresist (203, 208), organic-based developers include n-butyl acetate, ethanol, hexane, benzene, toluene, and the like. Aqueous developers can include aqueous solvents such as tetramethyl ammonium hydroxide, KOH, NaOH, and the like. In an embodiment, superconductor layer 202 is etched according to sensor pattern 205 of patterned photoresist (203, 208). Photoresist (203, 208) can be subsequently removed using a suitable method such as by plasma ashing, flushing using oxygen, nitrogen plasma, and the like. Etching of superconductor layer 202 forms superconductor sensor layer 207 with sensor pattern 205. Etching can be accomplished using any suitable method including a dry etching process, a wet etching process, other suitable etching process, a reactive ion etching (RIE) process, or a combination thereof. In an embodiment, a dry etching process is implemented and employs an etchant gas that includes an oxygen-containing gas (e.g., O2), a carbon-containing gas (e.g., CxHy, where x and y may be any integers), a fluorine-containing etchant gas (e.g., CxFy, CxHyFz, NxFy, and/or SxFy, where x, y, and z may be any integers), a chlorine-containing gas (e.g., Cl2, CHCl3, CCl4, and/or BCl3), a bromine-containing gas (e.g., HBr and/or CHBR3), an iodine-containing gas, other suitable gases or plasmas, or a combination thereof.

Superconductor sensor layer 207 can be superconducting at a temperature from 0.1 K to 20 K. Transition temperature $T_c$ of superconducting multi-layer transition-edge sensor 200 can be from 0.01 K to 15 K.

Superconducting multi-layer transition-edge sensor 200 can be made in various ways. It should be appreciated that superconducting multi-layer transition-edge sensor 200 includes a number of optical, electrical, or mechanical components, wherein such components can be interconnected and placed in communication (e.g., optical communication, electrical communication, fluid communication, mechanical communication, and the like) by physical, chemical, optical, or free-space interconnects. The components can be disposed on mounts that can be disposed on a bulkhead for alignment or physical compartmentalization. As a result, superconducting multi-layer transition-edge sensor 200 can be disposed in a terrestrial environment or space environment.

Figure 2:
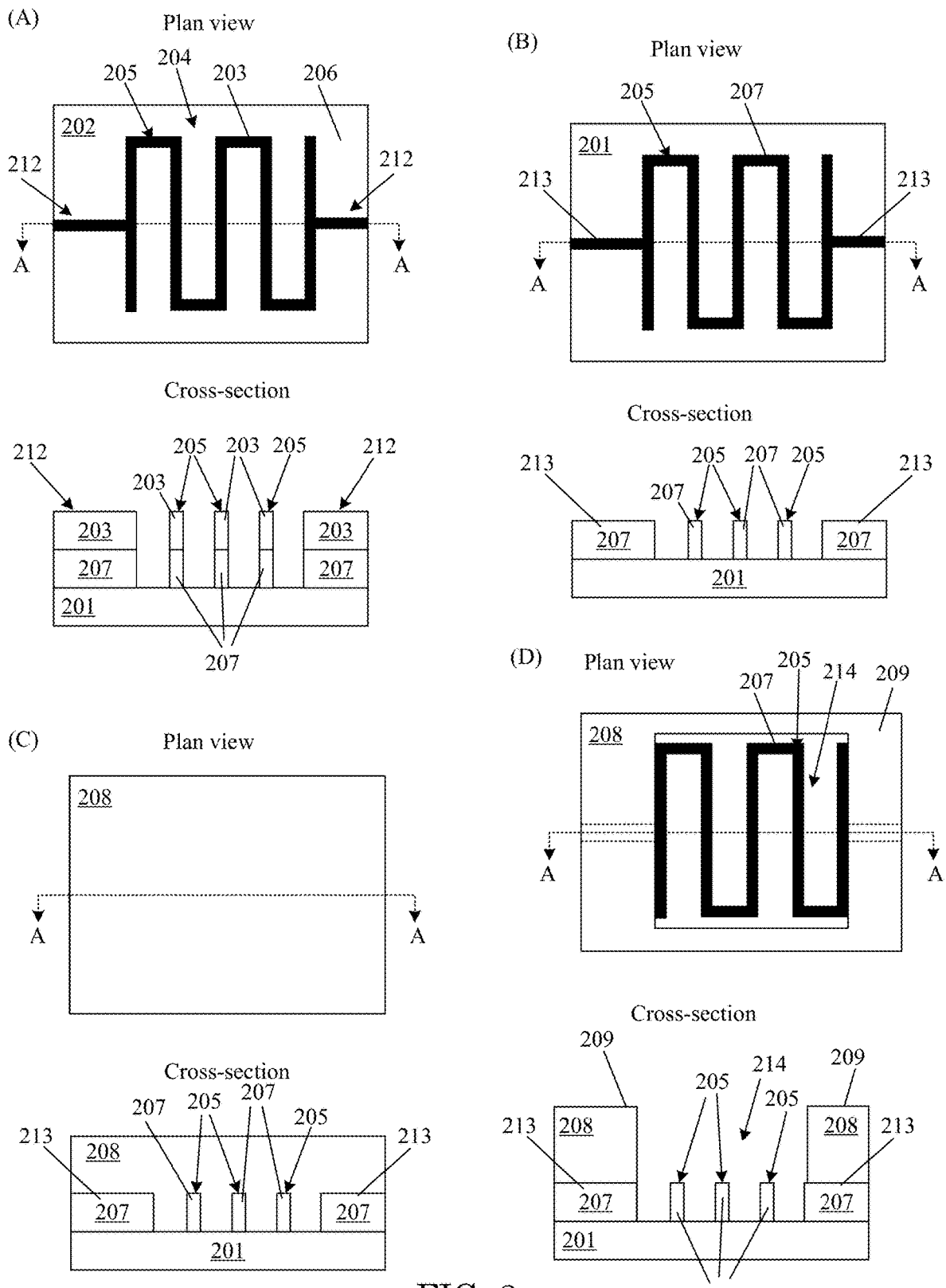
FIG. 2 shows plan views and cross-sections of materials for steps in forming the superconducting multi-layer transition-edge sensor shown in panel B of FIG. 3.

In an embodiment, with reference to FIG. 1, FIG. 2, FIG. 3, FIG. 4, FIG. 5, FIG. 6, FIG. 7, and, FIG. 8, a process for making superconducting multi-layer transition-edge sensor 200 includes: forming superconductor layer 202 on substrate 201, superconductor layer 202 including nascent topography 204 as exemplified in FIG. 1b (e.g., by DC-magnetron sputtering or electron-beam evaporation); forming patterning photoresist 203 on superconductor layer 202 such that superconductor layer 202 is interposed between patterning photoresist 203 and substrate 201 as exemplified in FIG. 1c (e.g., by spin coating or spray coating); forming sensor pattern 205 in patterning photoresist 203 and exposing exposed portion 206 of superconductor layer 202 for removal as exemplified in FIG. 1*d* (e.g., by projection, contact, or direct-write UV exposure); subtractively forming, from superconductor layer 202, superconductor sensor layer 207 including sensor pattern 205 by removing exposed portion 206 from superconductor layer 202 as exemplified in FIG. 2*a* (e.g., by a wet chemical etching process, dry etching process, or argon ion milling); removing patterning photoresist 203 from superconductor sensor layer 207 as exemplified in FIG. 2*b* (e.g., by solvent based removal or oxygen plasma removal); forming template photoresist 208 on superconductor sensor layer 207 such that superconductor sensor layer 207 is interposed between template photoresist 208 and substrate 201 as exemplified in FIG. 2*c* (e.g., by spin coating or spray coating); forming inverse normal metal layer pattern 209 in template photoresist 208 and exposing bilayer portion 214 of superconductor sensor layer 207 for addition of normal metal layer 210 as exemplified in FIG. 2*d* (e.g., by projection, contact, or direct-write UV exposure); and additively forming normal metal layer 210 including normal metal pattern 211 on superconductor sensor layer 207 such that sensor pattern 205 is interposed between normal metal layer 210 and substrate 201 to produce the superconducting multi-layer transition-edge sensor 200 (as shown in FIG. 3*b*) as exemplified in FIG. 3*a* (e.g., by dc-magnetron sputtering or electron-beam evaporation).

In an embodiment, hybrid subtractive-additive production of a superconducting multi-layer transition-edge sensor 200 includes removing template photoresist 208 from superconductor sensor layer 207 as exemplified in FIG. 3*b* (e.g., by solvent based removal or oxygen plasma removal).

In an embodiment, forming sensor pattern 205 in superconductor layer 202 includes forming sensor wire 213 from superconductor layer 202 in electrical communication with sensor pattern 205, wherein superconductor sensor layer 207 includes sensor pattern 205 and sensor wire 213 by forming sensor wire 213 at the same time as sensor pattern 205.

In an embodiment, with reference to FIG. 5, FIG. 6, FIG. 7, and FIG. 8, the process for hybrid subtractive-additive production of a superconducting multi-layer transition-edge sensor 200 includes independently forming a plurality of normal metal layers 210. Here, the process can include forming second template photoresist 208.2 on superconductor sensor layer 207 and first normal metal layer 210.1 such that superconductor sensor layer 207 is interposed between second template photoresist 208.2 and substrate 201 as exemplified in FIG. 7*b* (e.g., by spin coating or spray coating); forming second inverse normal metal layer pattern 209.2 in second template photoresist 208.2 and exposing second bilayer portion 214.2 of superconductor sensor layer 207 for addition of second normal metal layer 210.2 as exemplified in FIG. 7*c* (e.g., by projection, contact, or direct-write UV exposure); and additively forming second normal metal layer 210.2 including second normal metal pattern 211.2 on superconductor sensor layer 207 such that sensor pattern 205 is interposed between second normal metal layer 210.2 and substrate 201 as exemplified in FIG. 8*a* (e.g., by dc-magnetron sputtering or electron-beam evaporation).

In an embodiment, the process for hybrid subtractive-additive production of a superconducting multi-layer transition-edge sensor 200 includes removing second template photoresist 208.2 from superconductor sensor layer 207 as exemplified in FIG. 8*b* (e.g., by solvent based removal or oxygen plasma removal).

The process for hybrid subtractive-additive production of a superconducting multi-layer transition-edge sensor 200 also can include performing thickness metrology of superconductor sensor layer 207 and normal metal layers 210. Thickness metrology can be accomplished using any suitable method that can quantifty the thickness at the 1% level. Exemplary methods include contact profilometry, non-contact profilometry, atomic-force microscopy, and X-ray flourescence. In this manner, the deposited film thickness and material removed in the oxide cleaning process can be calibrated and measured. Absolute thickness and spread in thickness across the wafer can be determined.

Figure 10:
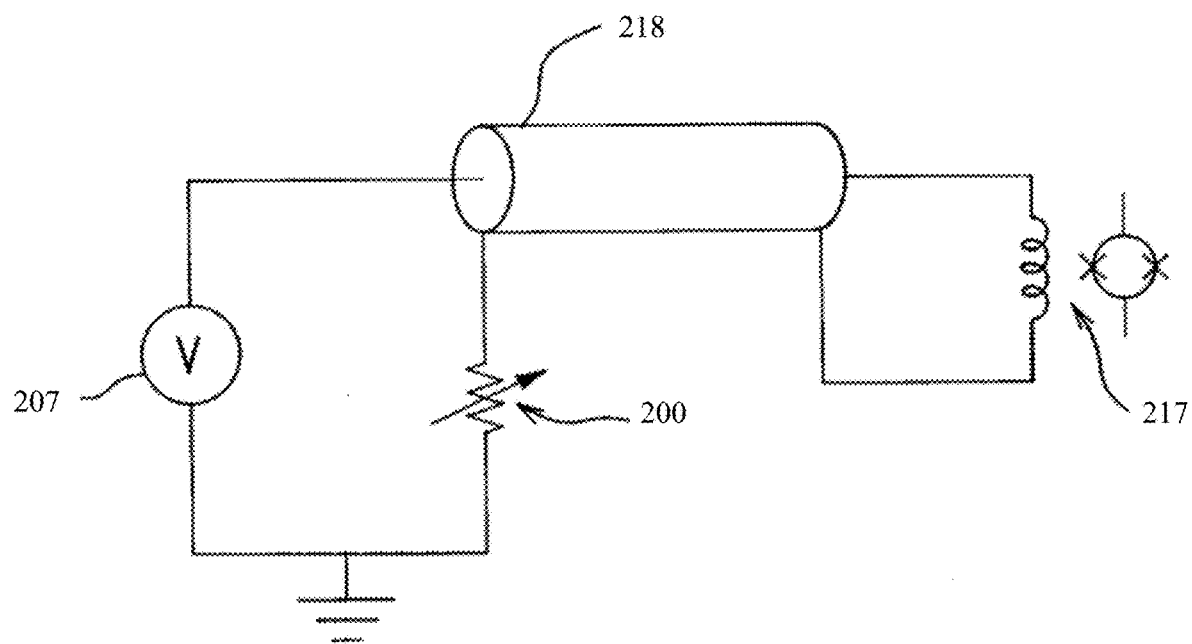
FIG. 10 shows a system for performing sensing with a superconducting multi-layer transition-edge sensor.

Superconducting multi-layer transition-edge sensor 200 has numerous advantageous and unexpected benefits and uses. In an embodiment, with reference to FIG. 10, can be used for sensing. Here, superconducting multi-layer transition-edge sensor 200 can be maintained in a transition region, wherein its properties are sensitive to a change in temperature of the superconducting multi-layer transition-edge sensor 200. In superconducting multi-layer transition-edge sensor 200, the energy of an absorbed particle is converted to heat by an absorber, and the transition from a superconducting to normal state of superconductor sensor layer 207 is used to sense the temperature rise. Transition temperature, Tc, of the bilayer of superconductor sensor layer 207 and normal metal layer 210 can be reproducibly controlled as a function of the relative thicknesses and the total thickness of superconductor sensor layer 207 and normal metal layer 210. The range of available transition temperatures $T_c$ can extend from less than 50 millikelvin (mK) to greater than 1.0 K, allowing superconducting multi-layer transition-edge sensor 200 to be selectively tailored to a particular application. For X-ray detection, transition temperature $T_c$ can be 50-150 mK. A span of the transition edge can be less than 0.1 mK, which provides very high detector sensitivity. A voltage can be applied across superconducting multi-layer transition-edge sensor 200, and the resulting current can be measured using a current amplifier such as a SQUID. The current that flows through superconductor sensor layer 207 is a function of the applied voltage and the temperature.

Superconducting multi-layer transition-edge sensor 200 can be used with many types of particles, including photons, molecules, electrons, ions, and phonons, including X-ray photons. Depending on the type of particle, the absorber can be a normal metal, superconductor, semiconductor, an insulator, substrate 201, or the bilayer, i.e., superconductor sensor layer 207 and normal metal layer 210. In an embodiment, the absorber is the normal metal of the normal metal layer 210. In an embodiment, with reference to FIG. 10, voltage source 216 is connected across superconducting multi-layer transition-edge sensor 200 to create a voltage potential across superconducting multi-layer transition-edge sensor 200. The voltage source can be, e.g., 0.05 µV to 5.0 µV. Electrical readout can be provided by SQUID current amplifier 217. A relative inductance of the input coil or SQUID can be ≈0.6 µH. SQUID current amplifier 217 can be connected to superconducting multi-layer transition-edge sensor 200 through superconducting wires 218. Superconducting wires 218 can be a twisted pair or a coaxial line and can be modeled as a transmission line of impedance $Z_{tr}$, which can be 50Ω. Superconducting wires 218, e.g., twisted conductor pair, forms a transmission line with mismatched impedances. The characteristic impedance of superconducting wires 218 can be 50Ω. A resistance of superconducting multi-layer transition-edge sensor 200 can be less than $Z_{tr}$ and can be about 0.1Ω. Resonant frequencies of the system shown in FIG. 10 can be determined by the length of superconducting wires 218.

Superconducting multi-layer transition-edge sensor 200 and processes for hybrid subtractive-additive production of superconducting multi-layer transition-edge sensor 200 disclosed herein have numerous beneficial uses. Advantageously, superconducting multi-layer transition-edge sensor 200 overcomes limitations of technical deficiencies of conventional compositions.

The process for hybrid subtractive-additive production of superconducting multi-layer transition-edge sensor 200, wherein superconductor sensor layer 207 is deposited and patterned completely with a subtractive process before subsequent layers are deposited and patterned using a separate additive process.

A superconducting multi-layer for transition edge sensors is a bilayer that includes a superconducting layer and a normal metal layer. Conventionally, both layers of the superconducting bilayer are deposited in the same deposition step without breaking vacuum. This ensures that interface between the two layers is of high quality. However, it also places limits on the available deposition and patterning techniques. The deposition either is the same for both layers, or a specialized chamber is used that accommodates multiple deposition approaches. Conventionally, superconducting bilayers are patterned using an additive approach during deposition or with subtractive approaches after deposition. Subtractive methods are difficult with noble metals frequently used in superconducting bilayers. In both of the conventional approaches, additional steps may be involved to eliminate superconducting shorts on the edge of the device.

With the process for hybrid subtractive-additive production of the superconducting multi-layer transition-edge sensor, the superconducting metal is formed and patterned first and provides for thickness measurement of the superconductor sensor layer earlier than in conventional transition edge sensor structures.

Additionally, the process for hybrid subtractive-additive production of the superconducting multi-layer transition-edge sensor, the normal metal layer can be designed to slightly overhang over the edge of the superconductor. This eliminates the requirement for additional normal metal features to suppress superconductivity on the edge of the device. The additional normal metal features can impact the current distribution in conventional transition edge sensor structures.

Additionally, the process for hybrid subtractive-additive production of the superconducting multi-layer transition-edge sensor forms a bilayer transition edge structure type not provided by conventional approaches. That is, superconductor sensor layer 207 can include a meander pattern wire, parallel filaments, or a mesh before normal metal layer 210 is formed. These structures provide tunable properties for the superconducting transition without significantly modifying the resistance of superconducting multi-layer transition-edge sensor 200. The process for hybrid subtractive-additive production of the superconducting multi-layer transition-edge sensor can be extended to multilayer structures of the normal metal layer 210 or superconductor sensor layer 207. A metal oxide on superconductor sensor layer 207 can be removed with a process that is uniform across substrate 201, e.g., through use of a deposition system that has a high uniformity in vacuum energetic ion based clean or use of an atmospheric plasma clean that can remove the metal oxide and provide a thin passivation layer delivers substrate 201 to the vacuum deposition system. Beneficially, removal of the metal oxide can decrease the thickness of the metal layer with uniformity to adjust the superconducting transition temperature of the multilayer.

With the process for hybrid subtractive-additive production of the superconducting multi-layer transition-edge sensor, formation of each layer occurs independently. For a gold layer in a molybdenum/gold material system, the gold layer can be patterned additively during deposition through a "lift-off" mask with no limit to the number of liftoff layers. With multiple liftoff layers, the gold thickness can be adjusted to modify the transition temperature and resistance of superconducting multi-layer transition-edge sensor 200. The amount of molybdenum pre-cleaning can be changed to modify the transition temperature for determination of bilayer properties with a calibration run. Further, the process for hybrid subtractive-additive production of the superconducting multi-layer transition-edge sensor can be used to produce hybrid sensor arrays for detection of multiple power or energy ranges.

Superconducting multi-layer transition-edge sensor 200 and processes herein unexpectedly provide the superconducting multi-layer transition sensors with similar properties as obtained with the conventional process. Further unexpectedly, the interface between superconductor sensor layer 207 and normal metal layer 210 can have a transparency comparable to that achieved with the conventional method.

The articles and processes herein are illustrated further by the following Examples, which are non-limiting.

EXAMPLES

Example 1. Development of a Transition-Edge Sensor Bilayer Process Providing Modalities for Critical Temperature Control Transition-edge sensors (TESs) are thermal detectors in which a superconducting film that is electrically biased in the superconducting-to-normal transition is used as a thermometer. In most TESs, the film is a superconductor-normal metal bilayer where the two materials and their thicknesses are chosen to achieve various specifications including the transition temperature K. Traditionally, the materials in the bilayer are deposited in sequence without breaking vacuum in order to achieve a clean, uniform bilayer interface at the wafer-scale. This approach leads to constraints in material properties, fabrication techniques and, ultimately, TES designs. To overcome these constraints, we have developed a bilayer fabrication process that allows the layers to be deposited and patterned separately with an exposure to atmosphere between the deposition steps. We demonstrate better than 6% transition-temperature uniformity across a 7.6 cm (3 in) substrate and present satisfactory spectra from TES x-ray detectors fabricated in this fashion. We show how the new hybrid additive-subtractive TES fabrication process creates new design possibilities, including broad tuning of $T_c$ across a substrate with a single bilayer thickness.

Transition-edge sensor microcalorimeters use the steep resistive transition between the superconducting and normal metal state to perform high-resolution energy-dispersive x-ray spectroscopy. Multiplexing schemes have enabled increasingly large arrays of TES pixels with higher photon count rates, while improvements in the modeling of TES parameters and noise guide pixel design. In order to reliably provide single pixels and arrays with state-of-the-art resolving power, these advances must be combined with reproducible fabrication techniques.

An ideal material system for a TES provides accurate, repeatable control of superconducting device properties. The transition temperature ($T_c$) contributes to many important parameters including heat capacity (C), thermal conductance (G), thermal noise, and the ultimate resolution of the sensor. The normal state resistance ($R_n$) determines the electrical time constant of the bias circuit in conjunction with the bias circuit's inductance and must be compatible with the multiplexing system chosen for a TES array. The normal state resistance is also inversely proportional to the internal thermal conductance of a TES. A wide range of material systems have been explored for TES fabrication including elemental superconductors, doped superconductors, and superconductor-normal metal bilayers. Doped and elemental superconductor thin films have found widespread use in bolometric applications; however, their relatively low internal thermal conductivity may lead to positional dependence during absorption events and preclude their use in calorimetry applications. As a result, TESs for microcalorimetry often consist of a superconductor-normal metal bilayer. The $T_c$ of the superconductor is suppressed through the proximity effect by the normal metal, and the ratio of the two film thicknesses determines the ultimate $T_c$ of the TES The addition of the normal metal increases internal thermal conductivity to be compatible with x-ray spectroscopy for material analysis and astronomy applications. A variety of materials have been used for bilayers including Mo—Au, Mo—Cu, Ti—Au, and Ir—Au.

The traditional bilayer fabrication process is based on the deposition of the superconducting and normal metal layers without breaking vacuum. This approach has advantages and disadvantages. Maintaining vacuum results in a clean bilayer interface which is helpful for $T_c$ repeatability and tunability. However, this standard process introduces several limitations on TES design and complicates the specific fabrication steps and tools used to create a detector. Requiring a single deposition chamber for both materials can be limiting. In the case of the bilayer MoAu, the respective deposition conditions are at odds with one another. High-quality, low-stress Mo films typically require a sputter system for high atom surface mobility whereas Au is ideally evaporated to achieve films with large grain sizes and high electrical conductivity. Rather than build a hybrid chamber with multiple deposition methods, researchers have found solutions employing standard deposition systems. The limitations of evaporated Mo have been bypassed by either heating the sample substrate to >500° C. or incorporating an ion-beam to increase Mo atom energy Another solution has been to sputter a thin Au capping layer over a sputtered Mo film, breaking vacuum, and then evaporating high-quality Au for the remainder of the bilayer.

Even with these advancements in bilayer deposition, the TES is still defined through top-down processing of the bilayer. The superconducting layer is deposited first on a pristine substrate to ensure superconductivity and film uniformity prior to being covered by the normal metal. This requires the normal metal to be patterned and etched while care is taken to avoid damaging the underlying superconducting film. If the normal metal is removed by the etchant used on the superconductor, then etching the superconductor last can lead to unproximated regions of superconductor along the edges of the bilayer. These regions produce superconducting electrical shorts between the leads of the TES, necessitating additional normal metal 'banks' to fully suppress superconductivity on the edges of the TES parallel to the direction of current flow. Furthermore, because both films of the bilayer are deposited successively under vacuum, the superconductor layer under the normal metal cannot be patterned, restricting TES designs and properties.

Here, we introduce the hybrid additive-subtractive TES (hasTES) process to mitigate these fabrication limitations. Our process is demonstrated with Mo—Au bilayers, but it is applicable to other material systems. We detail the fabrication process, demonstrate control of important TES parameters at the wafer-scale, and show spectra from functioning TES x-ray sensors.

We chose Mo—Au to demonstrate the hasTES process. As is detailed in FIG. 4, we first load a 7.6 cm (3 in) wafer into a DC sputter chamber to deposit a thin-film of low-stress molybdenum (Mo). After deposition, we break vacuum and pattern the Mo with positive i-line photoresist to define leads and the bottom film of the TES bilayer. Breaking vacuum and patterning the superconductor prior to normal metal deposition provides researchers new options for designing TESs as described later in section 8. Shown in FIG. 4 (*d*) is the ability to create normal regions perpendicular to the direction of current flow, called 'bars,' that are used to tune TES parameters, including noise and slope of the superconducting-normal transition, directly into the superconductor. We use a wet etch to pattern the Mo film, although the process is also compatible with an ion mill for an anisotropic etch. After etching the Mo, the wafer is patterned with a lift-off resist to define the second part of the bilayer. The normal metal can overhang the superconductor by a few micrometers to eliminate superconducting shorts; additional thick normal metal 'banks' are not required. Furthermore, the introduction of a lift-off process removes any concern regarding etch selectivity between the layers, and multiple lift-off steps of different Au thicknesses enables TESs with a range of $T_c$ s on a single wafer. This latter attribute may prove useful for hybrid arrays but also allows for rapid prototyping of new pixel designs. The electron-beam evaporated Au is preceded by a 1 min Ar ion RF plasma sputter clean (14 mTorr, 60 W, 350 V) in the evaporation chamber to ensure a clean bilayer interface, despite breaking vacuum. Finally, after the Au evaporation and lift-off is complete, the bilayer undergoes a 20 min anneal at 150° C. to stabilize $T_c$ and $R_n$.

A useful bilayer fabrication process requires that the $T_c$ and $R_n$ of TES pixels are uniform across a single wafer and repeatable from wafer to wafer. Furthermore, altering the thickness ratio of normal metal to superconductor should result in a predictable change in $T_c$ and $R_n$. As such, it is important that the hasTES process yields uniform film thickness and bilayer interface transparency at the wafer-scale, with the latter being addressed in detail in section 4. Evaporated Au thickness uniformity across a 7.6 cm wafer is easy to measure with a profilometer and we achieve better than 1% thickness variation across the wafer. The Mo superconducting film, however, is typically much thinner (~40 nm) with surface roughness on the order of ~4 nm, making profilometer measurements difficult. To address this, we deposited 45 nm of Mo onto a 7.6 cm oxidized Si wafer. We then patterned and wet-etched the Mo film into 25 square, 1 cm×1 cm. A room-temperature four-point probe was used to measure the resistance of each Mo square. Resistance is inversely correlated with film thickness, so this resistance variation measurement provides a method to track thickness variation (it should be noted that thin-film effects may exaggerate measured differences in resistance, thus, actual uniformity is likely better than recorded).

After sputtering, the 45 nm Mo film has a better than 1.5% thickness deviation across the wafer, with the film thicker on average at the center of the wafer. However, to ensure a clean Mo—Au interface after breaking vacuum and patterning the superconductor layer, we employ a 60 W Ar ion RF plasma sputter clean in the evaporator directly prior to Au deposition. The plasma sputter clean etch rate for Mo is approximately 1 nm min$^{-1}$ and thus its effect on thickness uniformity must be determined. We subjected the previously described patterned Mo wafer to a ~1 min plasma clean and again measure resistance. Post-clean, the thickness deviation is now 1%, an improvement upon the as-sputtered wafer. This is due to the plasma cleaning more aggressively at the center of the wafer and smoothing the initial radial thickness profile from the sputter tool. We repeated this procedure for two additional 2 min cleans and found the radial thickness profile to continue to evolve with worsening thickness uniformity. After 3 min of RF sputter cleaning, the deviation is at ~6% and further increases to ~18% after 5 min, with large variation between the edge and center of the wafer. As such a gradient would directly translate to a large $T_c$ variation in a TES array, it is crucial to keep plasma clean times short (~1 min). Using this 1 min plasma clean limit, an example 45 nm Mo/520 nm Au bilayer yielded $T_c$=104±3 mK across the full extent of a 7.6 cm wafer, indicating suitability of the hasTES process towards fabricating large-scale arrays.

A model to approximate the $T_c$ of a superconductor normal metal bilayer derived from the Usadel equations assumes a bilayer in the thin limit with a uniform superconductor (no spatial dependence or pair breaking due to impurities, fields, or currents). The following equation can be used for calculating $T_c$ based off the superconductor film thickness $d_s$, the normal metal film thickness $d_m$, the superconductor critical temperature $T_{co}$, and the bilayer interface transparency t:

$$T_c = T_{co}\left[\frac{d_S}{d_0}\frac{1}{1.13(1+1/b)}\frac{1}{t}\right]^b \quad (1)$$

$$\frac{1}{d_0} = \frac{\pi}{2}k_B T_{co}\lambda_f^2 n_S$$

$$b = d_M n_M / d_S n_S$$

where $n_S$ and $n_M$ are the respective superconductor and normal metal density of states and $\lambda_f$ is the normal metal Fermi wavelength. A modification of the above equation is also presented for films outside the thin film limit. However, the difference may be negligible for Mo/Au bilayers with thicknesses comparable to that used here so that the above equation is a first order approximation.

Figure 11:
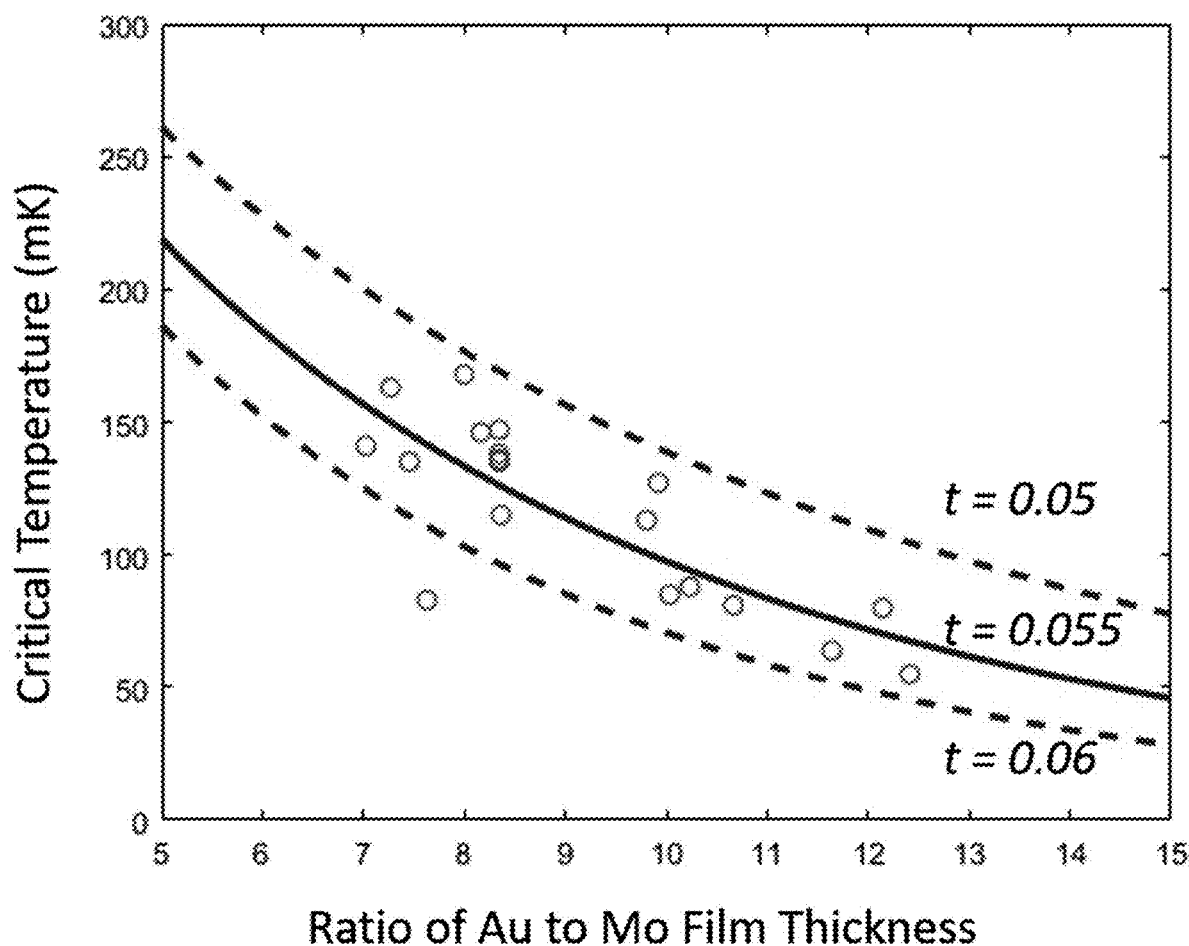
FIG. 11 shows a graph of critical temperature versus a ratio of Au to Mo film bilayer thickness, wherein circles are different fabrication runs, and lines are provided for different transparency values. A consistent interface transparency is seen across a broad range of material thicknesses, even when breaking vacuum in making the superconducting multi-layer transition-edge sensor. Mo films range from 35 nm to 45 nm while Au thicknesses range from 300 nm to 600 nm.

With the $T_c$ known, (1) can be used to calculate t, a measure of electron transmission through the bilayer. For a perfect interface, t=1, while the proximity effect of the normal metal on the superconducting film will decrease as t→0. Calculated t for several MoAu bilayer and trilayer cases using traditional bilayer fabrication methodology provide a consistent value of t=0.09-0.1 when assuming $T_{co}$=1000 mK, $n_{Mo}$=0.29×10$^{23}$ states eVcm$^{-3}$, $n_{Au}$=0.107× 10$^{23}$ states eVcm$^{-3}$, and $\lambda_f$=0.524 nm. Combining these values with several film thicknesses of our bilayers across a range of $T_c$ s, we obtain t~0.05-0.06 with a 1 min RF plasma clean (FIG. 11). Longer plasma cleans do not appreciably enhance t, and no cleaning yields a t lower than ~0.03. In comparison with a traditional MoAu bilayer fabrication, we see that breaking vacuum with the hasTES process prevents t from being fully recovered, even with a plasma clean. Fortunately, t is constant across a broad range of $T_c$ s and does not affect the ultimate resolution of a TES. Lower t can be compensated by an increase in the ratio of Au thickness to Mo thickness to suppress $T_c$ as needed. The hasTES process requires approximately twice the thickness of Au to suppress the $T_c$ of Mo relative to a traditional MoAu bilayer. While this can be compensated by making the Mo film thinner, hasTES pixels tested in section 7 typically have 0.5 μm of Au or more. This thick normal metal layer improves absorption efficiency in the soft x-ray regime, but also increases the heat capacity per unit area compared to a MoAu bilayer with the same thickness of Mo and a higher t value. While the thicker normal metal is useful in many applications, it may prove limiting when a very low heat capacity per unit area is desired Section 8 discusses a potential solution to this restriction using the design flexibility afforded by the hasTES process. Furthermore, future work will investigate the effects of varying RF plasma clean power, applying an atmospheric plasma pre-clean, and/or a surface passivation layer if an application demands a higher t. We will also seek to detail the uncertainty of predicting $T_c$ at specific Mo thicknesses as a function of Au bilayer thickness.

Figure 12:
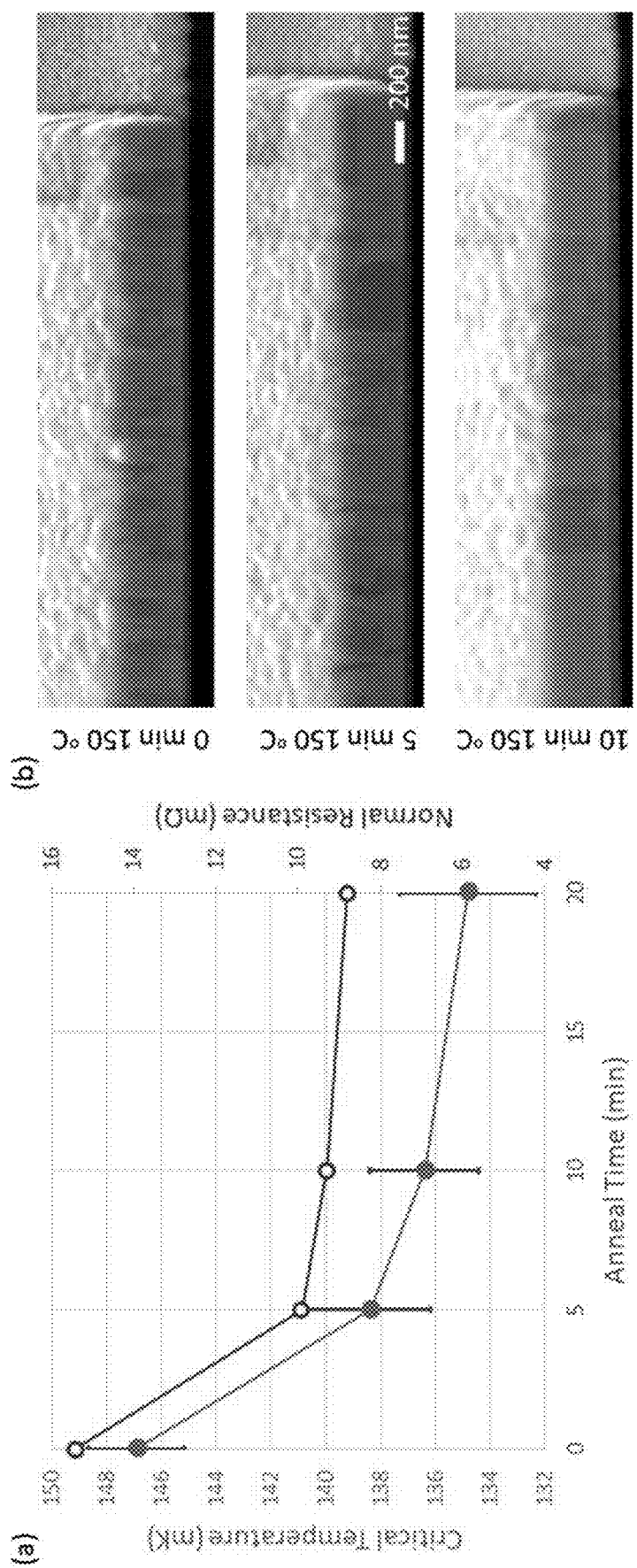
FIG. 12 shows, in panel A, a graph of critical temperature versus anneal time, wherein hollow circles are average $R_n$ as a function of anneal time for a 36 nm Mo/300 nm Au bilayer. A 5 min anneal at 150° C. shows a 30% reduction in R while further anneals show minimal change. Filled, circles are average $T_c$ as a function of anneal time. Here, ~9 mK drop occurs with the first 5 minutes of anneal before $T_c$ stabilizes. Panel B shows SEM images of a cross-sectioned bilayer appear to show a change in the Au grain morphology after a 0 min, 5 min, and 10 min anneal. Grains were initially less than 100 nm and increased to several hundred nanometers after a 10 min anneal.

5. Annealing to stabilize $T_c$ and $R_n$. During the fabrication process of a TES pixel, the bilayer is exposed to several thermal steps. These include a 5 min 150° C. post-bake of the lift-off resist prior to each normal metal evaporation and a 60 min 135° C. oven bake to wax bond the TES array to a carrier wafer for back-side deep reactive ion etching to define membranes. To test hasTES process thermal susceptibility to these temperatures, Mo/Au (36 nm/300 nm) bilayer four-point probe test structures with 1 sq resistance were fabricated on a Si wafer. The wafer was diced into 6 mm×6 mm chips and the $T_c$ and $R_n$ was measured for a single test structure on 32 of these chips from the center of the wafer. Afterwards, three groups of eight chips each underwent a further anneal on a hotplate in atmospheric conditions at 150° C. for 5 min, 10 min, and 20 min respectively. As can be seen in FIG. 12, a decrease of >30% $R_n$ is seen with a 5 min anneal while this value appears to stabilize after a 20 min anneal. Changes in $T_c$ are smaller by comparison, but a 5 min anneal still yields a ~9 mK drop in $T_c$ with values once again stabilizing after a 20 min anneal. Scanning electron microscopy (SEM) imaged cross-sections provide evidence that anneals may be increasing Au grain size, leading to the large reduction in $R_n$ (FIG. 12(b)). These results indicate the importance of an anneal post-deposition of the bilayer to ensure predictability and repeatability of $T_c$ and $R_n$. Processing that exposes the bilayer to higher temperatures may necessitate a higher annealing temperature.

An aspect of a successful bilayer TES fabrication process is compatibility with traditional absorber materials for TES applications above the soft x-ray regime. Bismuth (Bi) is one of the most common absorbers in microcalorimeters due to its low heat capacity (limited effect on TES properties) coupled with its relatively high atomic number (efficient at stopping high-energy photons). Recently, the TES community has moved to electroplated Bi which minimizes the low-energy tails seen in x-ray spectra taken with evaporated Bi absorbers. The difference in low-energy tail performance is an active area of study, and it may be correlated with Bi grain size. Electroplated Bi has a large grain size (0.5 μm-1 μm) relative to that of evaporated Bi (~30 nm).

While several working Bi electroplating recipes exist in the field, we sought to reduce their reliance on multiple additives and sensitivity to factors such as pH on a run-to-run basis. Using industry-established methods for Sn-plating as a foundation, the following solution was developed 10 g of Bi nitrate pentahydrate, 40 g of 70% by weight methane sulfonic acid (MSA), and 500 ml de-ionized (DI) water.

Figure 13:
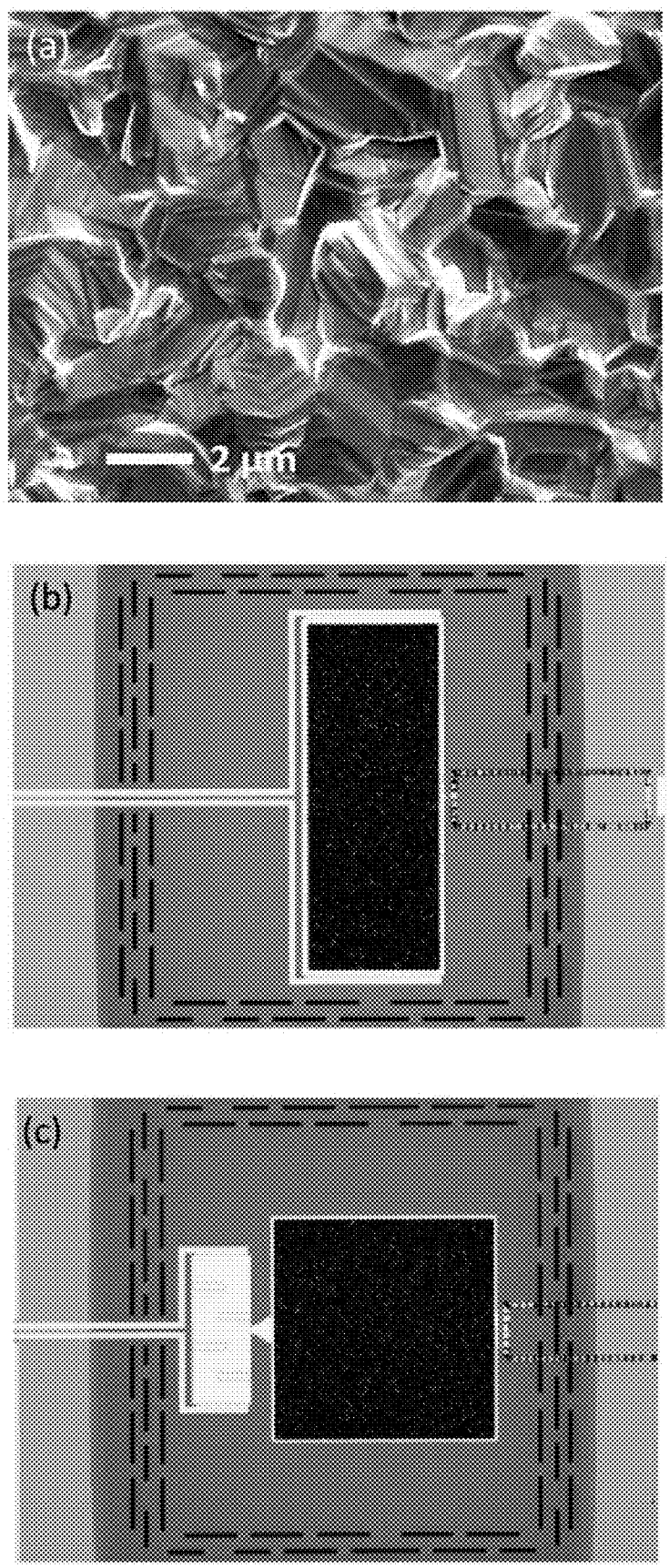
FIG. 13 shows, in panel A, an SEM image of electroplated Bi from an MSA-based solution. Grain sizes about 2 μm correlate with a reduced low-energy tail during x-ray spectroscopy. Panel B shows a superconducting multi-layer transition-edge sensor with 3 μm of Bi electroplated directly on the bilayer for lower x-ray energy applications and on an attached sidecar in panel C for higher x-ray energy applications. A sidecar can be used for high energy applications where the need for a larger dynamic range allows a higher heat capacity detector. In this case, the functionality of the absorber can be separated from that of the superconducting multi-layer transition-edge sensor and the two components can have different sizes. Sidecars also provide an ideal platform for very thick Bi absorbers to remove any risk of thick Bi affecting superconducting multi-layer transition-edge sensor behavior.
Figure 14:
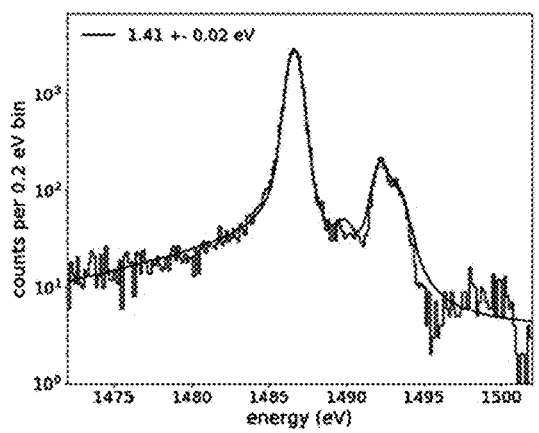
FIG. 14 shows Al Kα spectra plotted for three different TESs. (a) A 1 μm thick evaporated absorber on a traditional MoCu TES with a 10% low-energy tail fraction. (b) A superconducting multi-layer transition-edge sensor with only the Au bilayer as the absorber showing a reduced tail fraction of 2.1%. (c) A superconducting multi-layer transition-edge sensor with 3 μm of electroplated Bi showing a tail fraction of 3%, comparable to the Au-only absorber. Differences in resolution are due to the fact that the superconducting multi-layer transition-edge sensor pixels have not been optimized for this x-ray energy.
Figure 14:
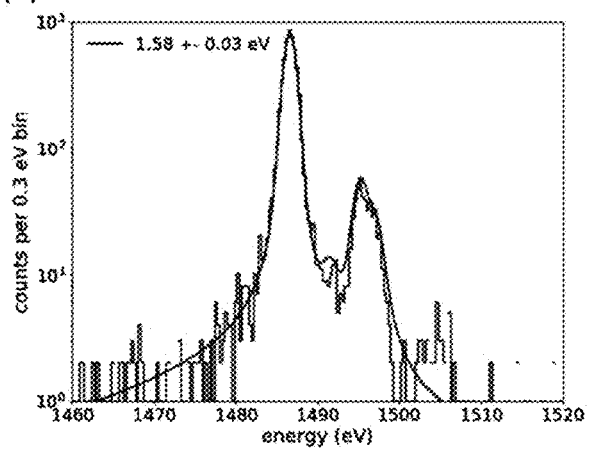
Figure 14:
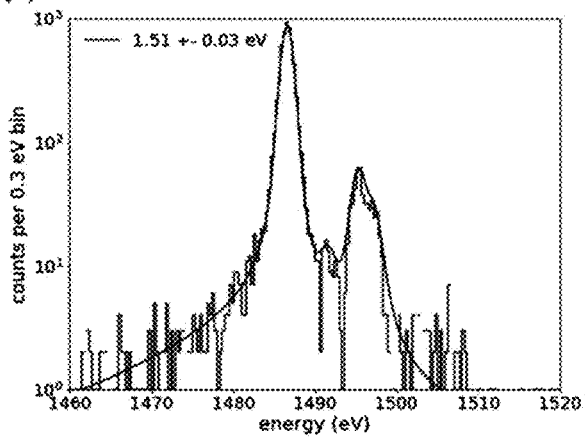

To form the solution, 40 g of MSA is combined with 100 ml of DI water. Next, 10 g of Bi nitrate pentahydrate salt is stirred into the beaker until fully dissolved. Finally, additional DI water is added to the beaker to bring the volume up to the final value. All plating was carried out in a commercial plating station optimized for low electrolyte volume (less than 200 ml for a 7.6 cm wafer). We are able to use fresh solution for each wafer (single-shot) thus eliminating the need for pH adjustment or ion replenishment over the course of multiple electroplating runs. With constant solution agitation, a 10 mA DC current yields a plating rate of ~0.5 µm min$^{-1}$ for a 1 cm$^2$ area. SEM imaging shows surface Bi grains about 2 µm in size with this recipe (FIG. 13(a)). The hasTES process is readily compatible with electroplated (and evaporated if desired) Bi absorbers in both sidecar (off to the side) (FIG. 13(b)) and on-TES bilayer designs (FIG. 13(c)). An Au seed connection is incorporated between the wafer edge and each TES to establish cathode contact. The wafer is then patterned with 7 µm 220-7 photoresist, ensuring that only Au absorber regions are exposed for plating. After the desired Bi film thickness is reached, the wafer is rinsed in DI water and the resist mask solvent-stripped. The final TES processing step requires the seed to be removed with an Au wet etch to eliminate thermal shorts between the TES and the Si frame. FIG. 14 shows Al Kα spectra for three different cases a traditional MoCu TES with an evaporated Bi absorber, a hasTES with an Au absorber, and a hasTES with a 3 µm electroplated Bi absorber. The MoCu pixel shows a tail fraction about 10% due to evaporated Bi, while the electroplated Bi TES shows a reduced tail fraction on the same order as an Au only absorber. The small residual tail fraction may be due to unaccounted for background events and/or electron escape from the absorber. Full characterization and testing of hasTES pixels will be covered in more detail in the following section.

With control of bilayer properties and absorber compatibility demonstrated, working pixels were fabricated to characterize the hasTES process' application to microcalorimetry. Pixels with a variety of saturation energies, $T_c$'s, and $R_n$'s were fabricated using test die (7 mm×14 mm) with 24 pixels. All measurements reported below were taken in a millikelvin cryostat with microwave multiplexed readout.

Figure 15:
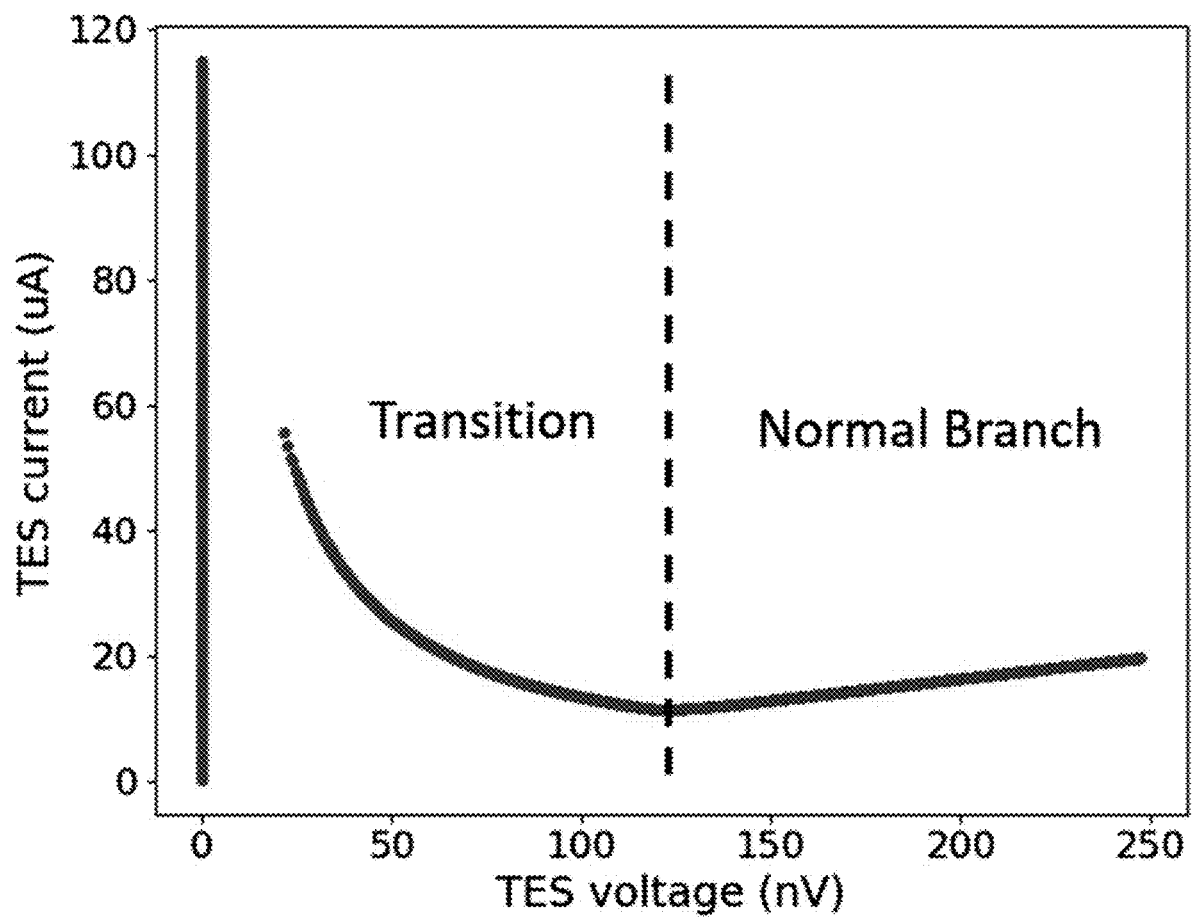
FIG. 15 shows a graph of current versus voltage (i.e., an I-V curve) of a pixel that includes a superconducting multi-layer transition-edge sensor with $T_c$=77 mK and $T_{bath}$=60 mK. The featureless transition between the superconducting region and the normal branch under increasing voltage bias indicate the pixel is well-behaved with a uniform bilayer.

Pixels were fabricated on a Si wafer with a 150 nm SiO$_2$/500 nm low-stress SiN$_x$ stack. The SiO$_2$ provides the backside etch-stop during DRIE etching of the membranes while the SiN$_x$ and remaining SiO$_2$ provide the membrane mechanical support. Taking advantage of the flexibility afforded by the hasTES process, wafer fabrication runs were typically included up to three different Au bilayer thickness yielding different $T_c$ s for each chip. With only the additional time of extra normal metal evaporations, this enables new TES designs to be rapidly prototyped with $T_c$ s, heat capacity, and ultimately energy resolution efficiently optimized on fewer fabrication runs. I-V curves were taken on a variety of TES designs, with a representative plot shown in FIG. 15. The pixel has a $T_c$ of 77 mK and the measurement was taken with a bath temperature ($T_{bath}$) of 60 mK. A featureless transition between the superconducting and normal branch under increasing voltage bias is clearly seen, indicating a well-behaved TES.

Figure 16:
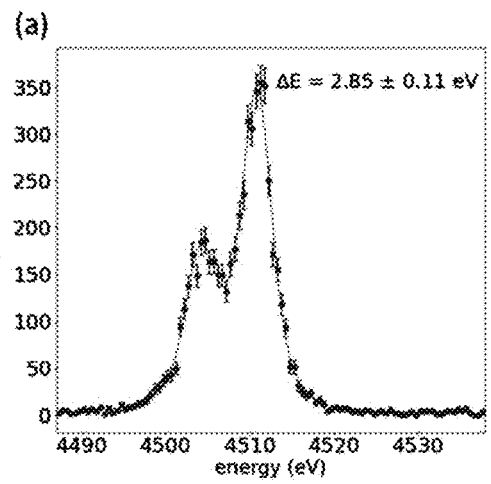
FIG. 16 shows X-ray spectra for pixels of superconducting multi-layer transition-edge sensors. (a) A 480 μm×240 μm pixel with $T_c$=70 mK and a saturation energy ($E_{sat}$) of ~6 keV yielded ΔE=2.85±0.11 eV for 4.5 keV Al K-α photons (Au bilayer as absorber). (b) A 465 μm×185 μm pixel with $T_c$=77 mK and $E_{sat}$~3 keV yielded ΔE=1.33±0.03 eV for 1.5 keV Al K-α photons (3 μm Bi absorber). (c) A 465 μm×185 μm pixel with $T_c$=50 mK and $E_{sat}$~1.2 keV yielded a predicted ΔE=0.56 eV for 705 eV iron L photons (Au bilayer as absorber). The Fe L-photon energy is not yet sufficiently modeled to provide a full spectrum. The relatively high saturation energy for all three pixels indicates that there is room for ΔE optimization while the large pixel areas make them ideal candidates for photon-starved experiments.
Figure 16:
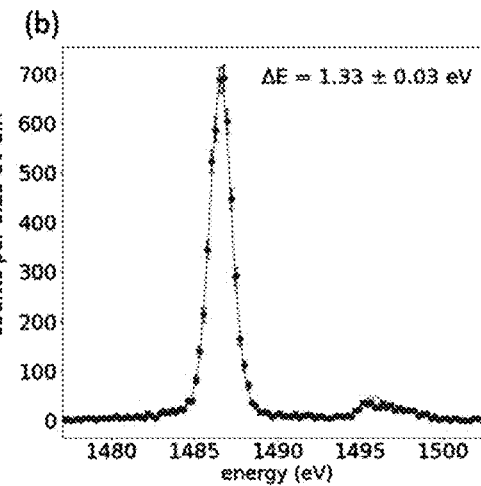
Figure 16:
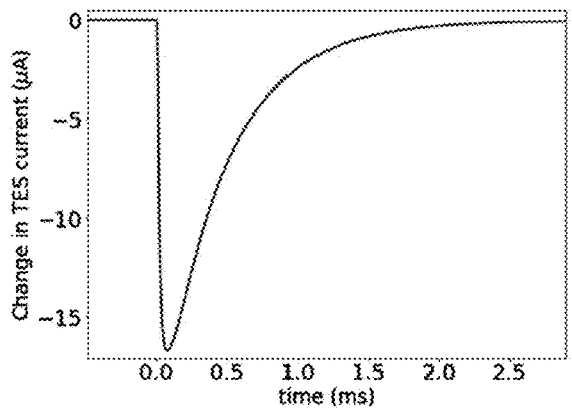

Pixels designed through the hasTES process are capable of covering a broad photon energy range with high absorption efficiency including <1 keV with Au-only absorber designs, 1 keV-10 keV with Bi electroplated directly on TES designs (FIG. 15(c)), and >10 keV with Bi electroplated on a sidecar designs (FIG. 15(b)). Currently, we have tested x-ray sources <5 keV and have demonstrated promising initial resolution results. We achieved an energy resolution (ΔE) of 2.85±0.11 eV with a $T_c$=70 mK pixel at the 4.5 keV Ti Kα line, 1.33±0.03 eV with a $T_c$=77 mK pixel at the 1.5 keV Al Kα line, and have predicted a resolution from signal to noise ratio data of 0.56 eV for 705 eV iron L photons (FIG. 16). As is detailed in FIG. 16, these pixels are all relatively large with saturation energies above their measured x-ray source. As such, they may have ideal applications to photon-starved experiments with their large collection area. Furthermore, there is room for further resolution improvement with these pixels through optimization of C, G, and α (the logarithmic derivative of resistance, $$\frac{T}{R}\partial R/\partial T\bigg)$$

depending on the application.

Figure 4:
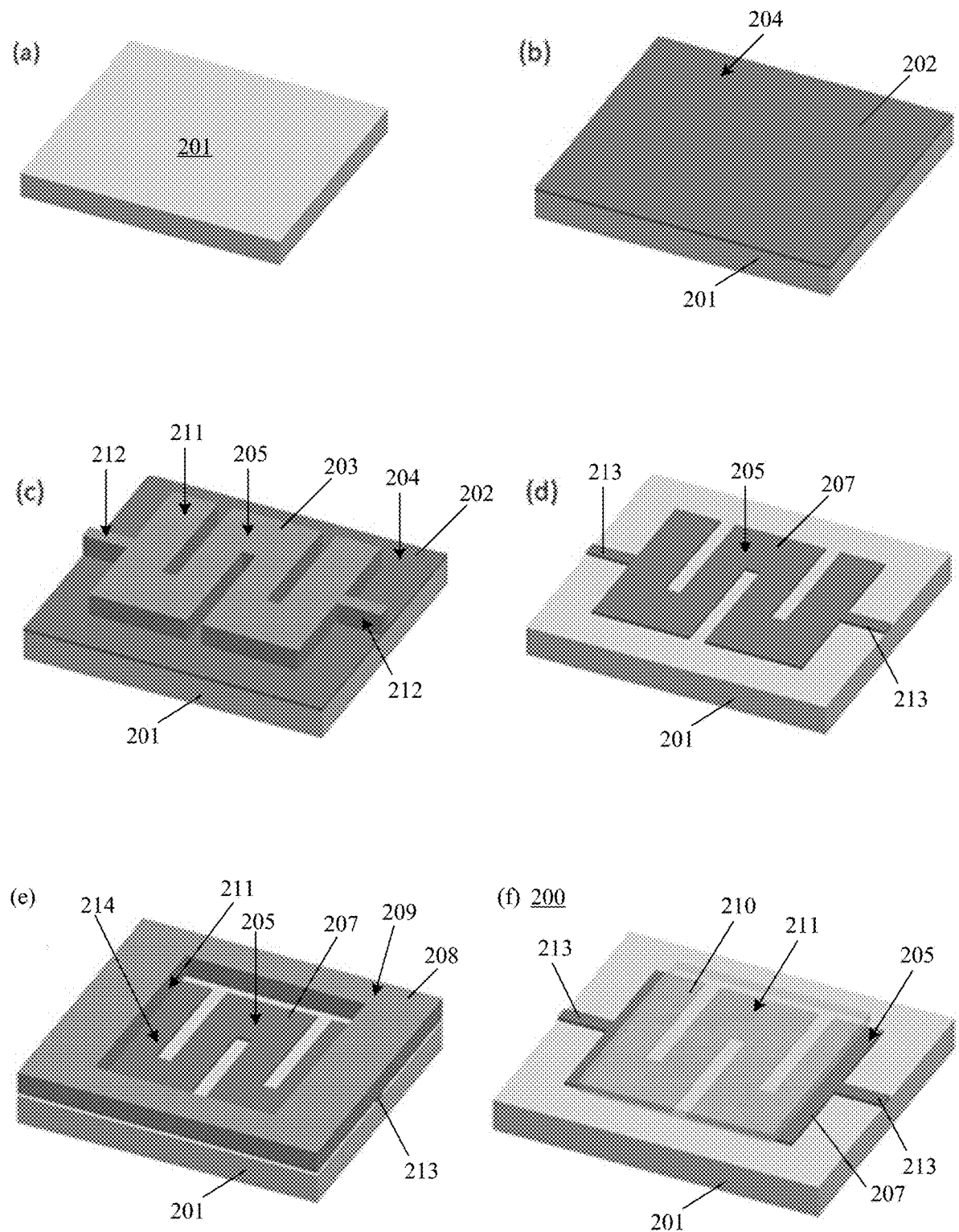
FIG. 4 shows perspective views of materials for steps in forming a superconducting multi-layer transition-edge sensor shown in panel B of FIG. 3.
Figure 5:
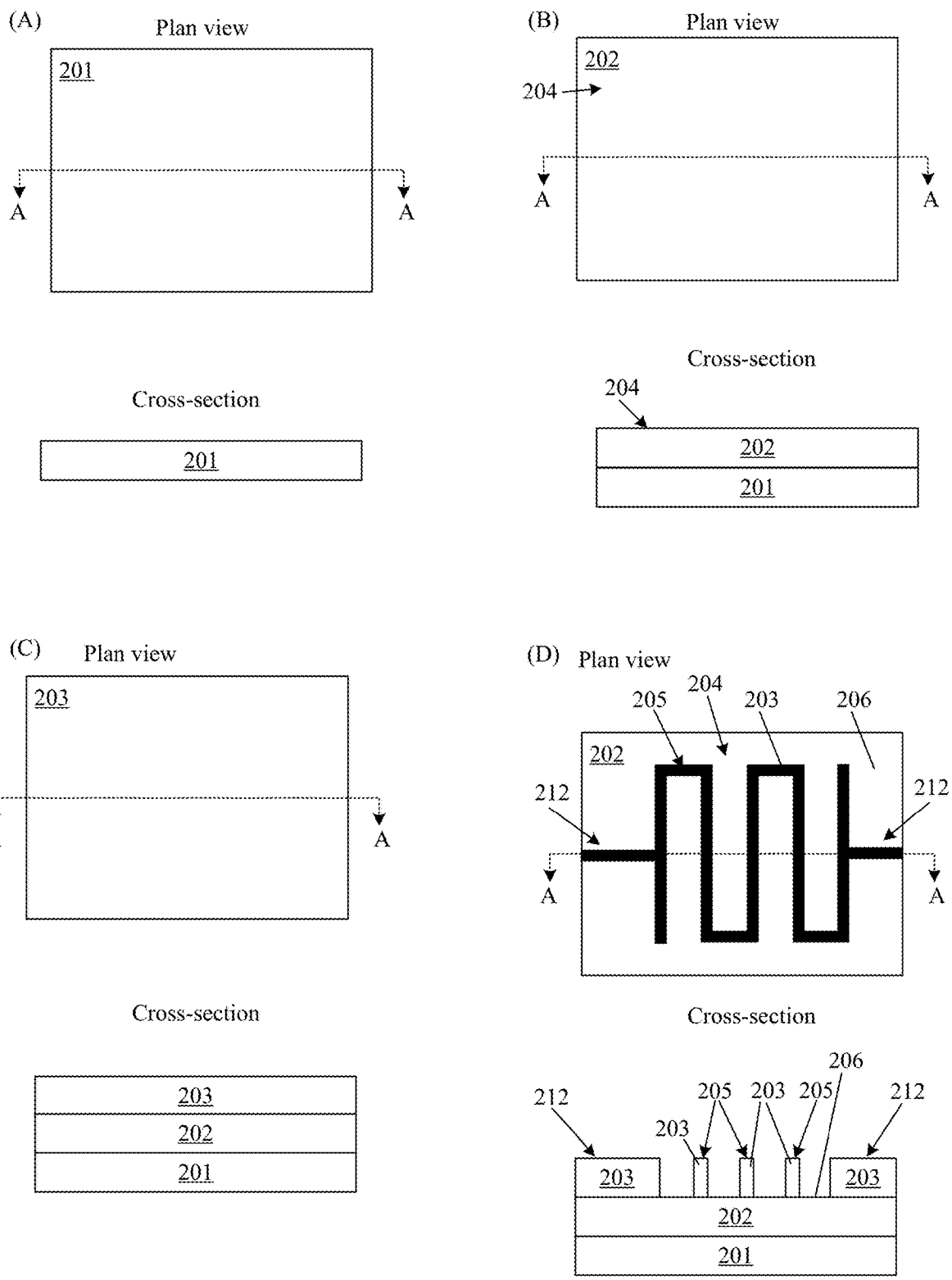
FIG. 5 shows plan views and cross-sections of materials for steps in forming a superconducting multi-layer transition-edge sensor shown in panel B of FIG. 8.
Figure 6:
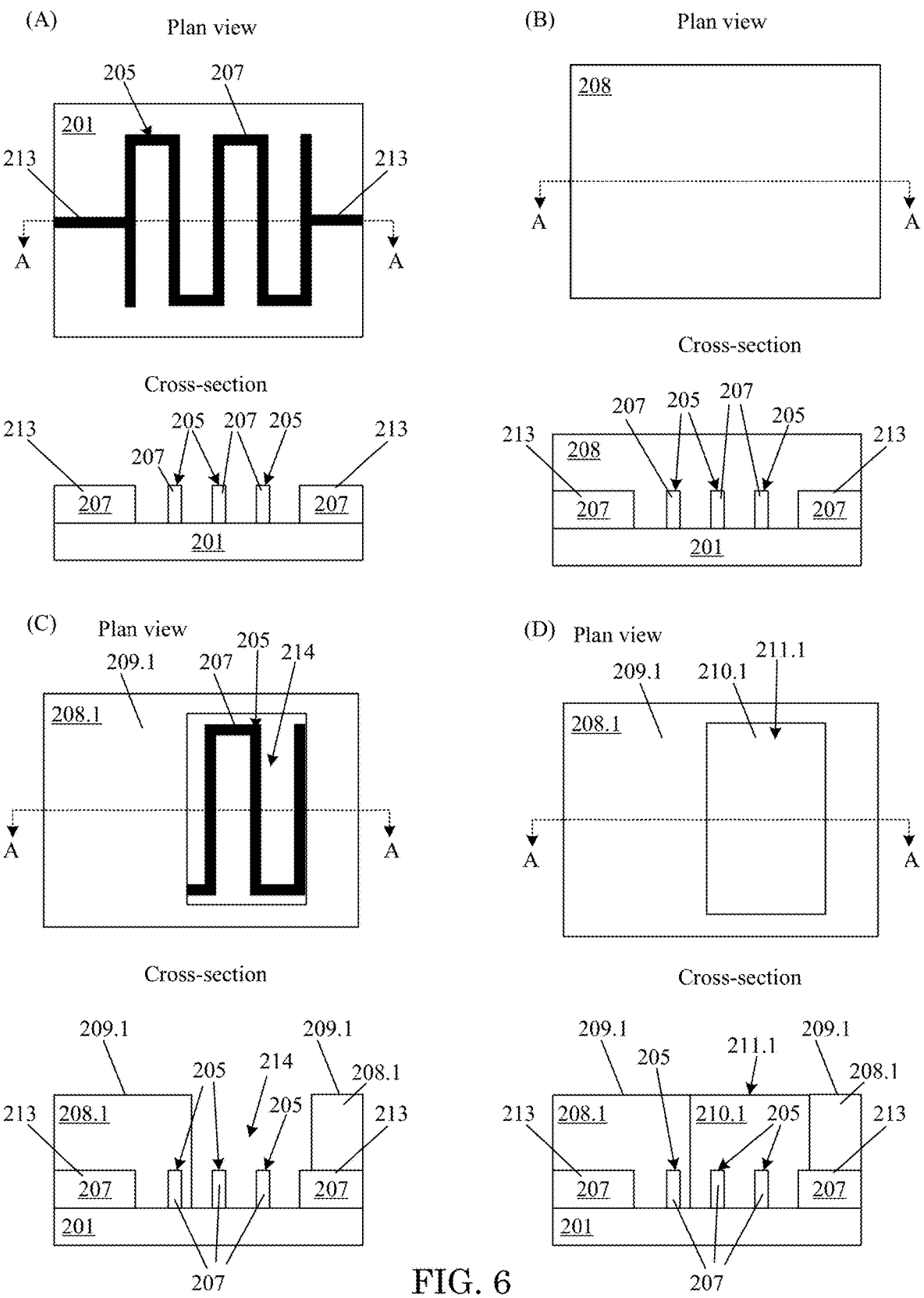
FIG. 6 shows plan views and cross-sections of materials for steps in forming a superconducting multi-layer transition-edge sensor shown in panel B of FIG. 8.

In addition to simplifying fabrication, the hasTES process enables new bilayer TES designs through patterning of the superconductor film. Previous fabrication processes typically use "banks" and "bars" to control the steepness of the superconducting transition. These features require additional fabrication steps and are essentially wasted heat capacity. Here we can control the transition steepness with "inverse bars" as seen in FIG. 4. Previous processes also have strong coupling between $T_c$, $R_n$, and C. For example, increasing the normal metal thickness will decrease $R_n$ and $T_c$ while increasing C. The ability to pattern the superconductor allows methods to control $R_n$, $T_c$, and C with less coupling. Here, we show the use of "filaments" which allow lithographic control of $T_c$ with almost no change in $R_n$ and C.

As is depicted in the inset of FIG. 17(b), filaments can be defined in the Mo layer of a TES. These structures are formed by wet etching a pattern of alternating regions of Mo so that stripes of uniform width parallel to each other and the direction of current flow through the TES remain. The entire structure is covered with an evaporated film of Au to complete the bilayer. Different variations of filaments were etched into the Mo film of a 45 nm Mo/350 nm Au bilayer on a single wafer. In FIG. 17(a), the transition of an unetched, standard test structure is shown with $T_c$=327 mK, $R_n$=15 mΩ, and a sharp transition. To the left of this curve is the transition of a test structure with 10 µm wide filaments with 5 µm of separation. For the same bilayer, the $T_c$ has now dropped to 323 mK while $R_n$ is effectively unchanged. This trend continues as the filament width is reduced progressively down to 1.5 µm (with spacing held constant at 5 µm for all samples), yielding $T_c$=117 mK and $R_n$~=16 mΩ (1 µm lines/spacing were also patterned and exhibited a $T_c$ below our cryostat $T_{bath}$=80 mK). Without changing bilayer thickness, this test of hasTES design capability demonstrates that $T_c$ can be tuned >200 mK with <10% Δ$R_n$.

Filaments with features sizes <2.5 µm show a noticeable broadening of the transition. While it is possible these changes are inherent to the design, it should be noted that these prototype devices are wet etched with agitation leading to undercutting and defects in the Mo filament uniformity which become more pronounced at thinner Mo filament dimensions. Future designs can employ an ion mill dry etch to improve feature edge definition. The mechanism for suppression of $T_c$ resulting from Mo etching is attributed to the lateral proximity effect from the Au filling the etched spacing between the Mo filaments. As the filaments narrow in width, the normal metal order parameter extends further into the Mo/Au filament bilayer, resulting in a lower $T_c$. A similar effect of normal metal bars on the $T_c$ of traditional MoAu TESs can occur, wherein supercurrent is guided through MoAu regions by normal metal bars that suppress superconductivity on either side of the current channel, creating a normal/superconducting/normal structure perpendicular to current flow. Our hasTES filament pixels have identical superconducting MoAu current paths but replace the normal Mo/Au/Au bar structure with a pure Au region without Mo. To model the effects of bar spacing (Mo filament width in our case), a nonlinear Ginzburg-Landau expression relates width of the superconducting channel sc to the suppressed transition temperature T:

$$s_c = \sqrt{\frac{\pi \hbar D_s}{2k_B(T_c - T)} \tan^{-1}\left[\frac{\pi}{2}\sqrt{\frac{D_s T}{D_N(T_c - T)}}\right]} \quad (2)$$

where $T_c$ is the transition temperature of the unmodified MoAu bilayer and $D_s$ and $D_n$ are the electronic diffusivities of the S and N regions, respectively. In FIG. 17(b), we plot the difference between the suppressed transition temperature of the devices with filaments and the MoAu bilayer transition temperature (T-$T_c$) as a function of filament width. Equation (2) is plotted against the measured data with $D_s$ floated and $D_n=2D_s$ as chosen in. The model provides a good fit to our experimental data, indicating that $T_c$ suppression in etched Mo structures behaves similarly to normal metal bars on traditional TESs.

Figure 18:
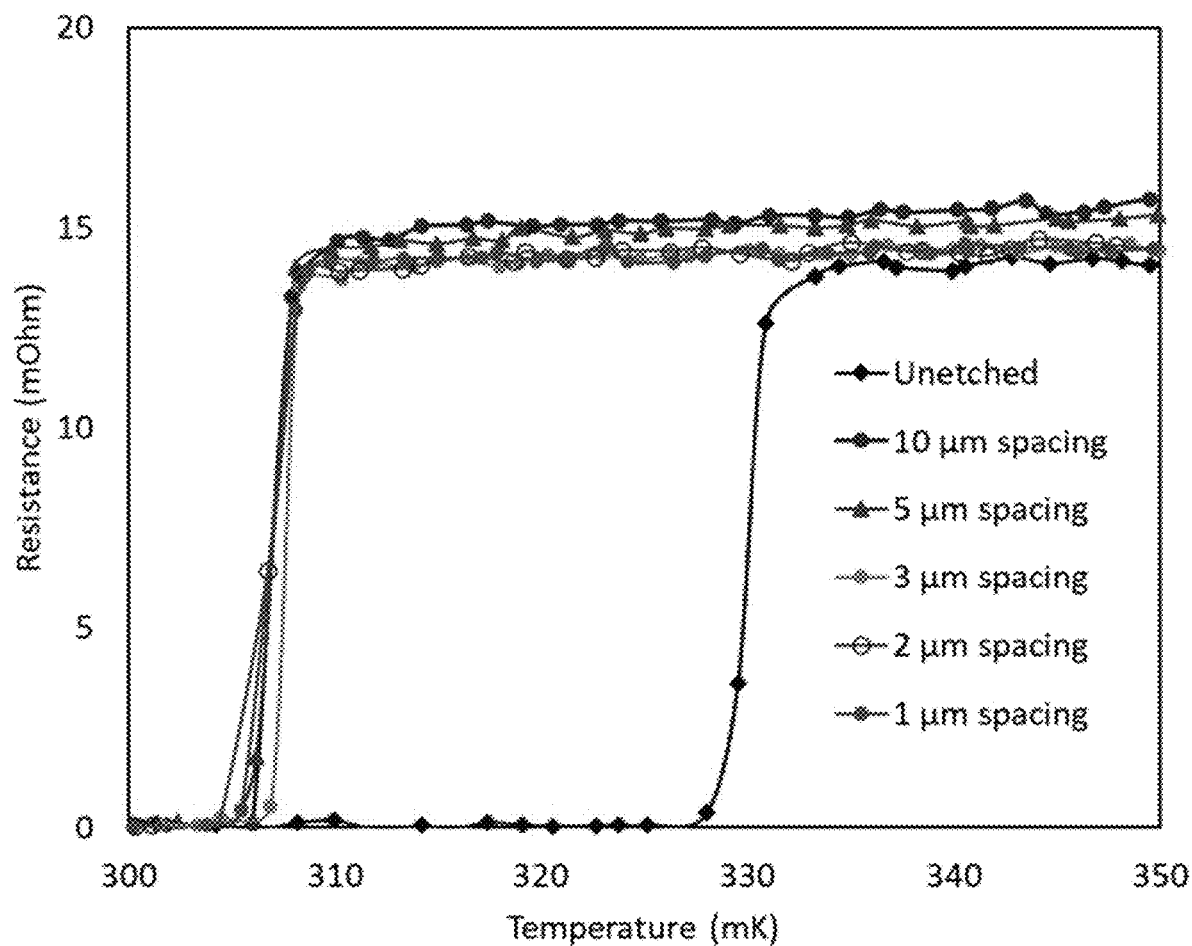
FIG. 18 shows a graph of resistance versus temperature for superconducting multi-layer transition-edge sensors that were measured where the Mo line width was held constant at 5 μm while the gap between the lines was varied between 1 μm and 10 μm. An unetched device was found to have $T_c$~327 mK while all patterned devices were shown to have comparable $T_c$ s of ~308 mK with similar transition widths. This result indicates that $T_c$ suppression is directly linked to filament width and independent of the gap between filaments.

We also created an array of devices with 5 μm wide Mo filaments where the spacing between the filaments was varied between 1 μm and 10 μm. As seen in FIG. 18, these five samples showed the same $T_c$ suppression, indicating that filament width, rather than spacing, is the dominant factor. While additional work is needed to further understand the behavior of filament TESs while under bias and absorbing photons, initial results offer a promising development in TES design flexibility. By taking advantage of $T_c$ suppression through features etched in a single superconducting layer, researchers will be able to broadly tune $T_c$ across a wafer independently of both C and $R_n$. Further work combining multiple filament widths into a single TES may also provide a new means of tuning the transition shape and, subsequently, the dynamic range of the sensor.

This Example demonstrates a fabrication technique used to create bilayer films for TESs. By breaking vacuum and introducing a patterning step between the deposition of the superconductor and normal metal layers, the hasTES process simplifies fabrication by eliminating selective etching constraints between bilayer materials as well as superconducting shorts at the edges of the bilayer. A uniform bilayer interface is maintained across a 7.6 cm wafer by use of an RF Ar ion plasma clean. Multiple normal metal evaporation steps expedite TES prototyping by creating multiple $T_c$ s on a single substrate. Furthermore, access to the superconducting film for patterning makes possible a wide variety of previously unstudied TES designs which offer the ability to tune $T_c$ across a broad range with a single bilayer thickness and with little variation in $R_n$ and C. The hasTES process is already suitable for a range of TES applications.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix (s) as used herein is intended to include both the singular and the plural of the term that it modifies, thereby including at least one of that term (e.g., the colorant(s) includes at least one colorants). Option, optional, or optionally means that the subsequently described event or circumstance can or cannot occur, and that the description includes instances where the event occurs and instances where it does not. As used herein, combination is inclusive of blends, mixtures, alloys, reaction products, collection of elements, and the like.

As used herein, a combination thereof refers to a combination comprising at least one of the named constituents, components, compounds, or elements, optionally together with one or more of the same class of constituents, components, compounds, or elements.

All references are incorporated herein by reference.

The use of the terms "a," "an," and "the" and similar referents in the context of describing the invention (especially in the context of the following claims) are to be construed to cover both the singular and the plural, unless otherwise indicated herein or clearly contradicted by context. It can further be noted that the terms first, second, primary, secondary, and the like herein do not denote any order, quantity, or importance, but rather are used to distinguish one element from another. It will also be understood that, although the terms first, second, etc. are, in some instances, used herein to describe various elements, these elements should not be limited by these terms. For example, a first current could be termed a second current, and, similarly, a second current could be termed a first current, without departing from the scope of the various described embodiments. The first current and the second current are both currents, but they are not the same condition unless explicitly stated as such.

The modifier about used in connection with a quantity is inclusive of the stated value and has the meaning dictated by the context (e.g., it includes the degree of error associated with measurement of the particular quantity). The conjunction or is used to link objects of a list or alternatives and is not disjunctive; rather the elements can be used separately or can be combined together under appropriate circumstances.

What is claimed is:

1. A process for hybrid subtractive-additive production of a superconducting multi-layer transition-edge sensor, the process comprising:
    forming a superconductor layer on a substrate, the superconductor layer comprising a nascent topography;
    forming a patterning photoresist on the superconductor layer such that the superconductor layer is interposed between the patterning photoresist and the substrate;
    forming a sensor pattern in the patterning photoresist and exposing an exposed portion of the superconductor layer for removal;
    subtractively forming, from the superconductor layer, the superconductor sensor layer comprising the sensor pattern by removing the exposed portion from the superconductor layer;

removing the patterning photoresist from the superconductor sensor layer;

forming a template photoresist on the superconductor sensor layer such that the superconductor sensor layer is interposed between the template photoresist and the substrate;

forming an inverse normal metal layer pattern in the template photoresist and exposing a bilayer portion of the superconductor sensor layer for addition of a normal metal layer; and additively forming the normal metal layer comprising a normal metal pattern on the superconductor sensor layer such that the sensor pattern is interposed between the normal metal layer and the substrate to produce the superconducting multi-layer transition-edge sensor.

2. The process of claim 1, further comprising removing the template photoresist from the superconductor sensor layer.

3. The process of claim 1, wherein forming the sensor pattern in the superconductor layer comprises forming a sensor wire from the superconductor layer in electrical communication with the sensor pattern, wherein the superconductor sensor layer comprises the sensor pattern and sensor wire.

4. The process of claim 1, wherein the superconductor sensor layer is superconducting at a temperature from 0.1 K to 10 K.

5. The process of claim 1, wherein the superconductor sensor layer comprises a superconducting metal.

6. The process of claim 5, wherein the superconductor sensor layer comprises an elemental superconductor or an alloy superconductor.

7. The process of claim 5, wherein the superconducting metal comprises molybdenum, iridium, or aluminum.

8. The process of claim 1, wherein the sensor pattern comprises a meander pattern, a filament pattern, a plenum pattern, a perforated pattern, or an aperture pattern.

9. The process of claim 1, further comprising forming a plurality of filaments in the sensor pattern of the superconductor sensor layer, and the sensor pattern comprises a filament pattern comprising the plurality of filaments.

10. The process of claim 9, wherein a width of each of the filaments is substantially identical within 1%.

11. The process of claim 9, wherein a width of some of the filaments is different to provide a selected transition temperature Tc to the superconducting multi-layer transition-edge sensor.

12. The process of claim 1, wherein the normal metal layer comprises a normal metal.

13. The process of claim 1, wherein the normal metal layer comprises gold, palladium, or silicon.

14. The process of claim 1, further comprising:

forming a second template photoresist on the superconductor sensor layer and the normal metal layer such that the superconductor sensor layer is interposed between the second template photoresist and the substrate;

forming a second inverse normal metal layer pattern in the second template photoresist and exposing a second bilayer portion of the superconductor sensor layer for addition of a second normal metal layer; and additively forming the second normal metal layer comprising a second normal metal pattern on the superconductor sensor layer such that the sensor pattern is interposed between the second normal metal layer and the substrate.

15. The process of claim 14, further comprising removing the second template photoresist from the superconductor sensor layer.

16. The process of claim 14, wherein the second normal metal layer comprises a normal metal.

17. The process of claim 14, wherein a thickness of the first normal metal layer is different than the second normal metal layer.

18. The process of claim 14, wherein a transition temperature Tc of the superconducting multi-layer transition-edge sensor is from 0.1 K to 15 K.

* * * * *